(12) United States Patent
Morita et al.

(10) Patent No.: US 6,879,378 B2
(45) Date of Patent: Apr. 12, 2005

(54) EXPOSURE APPARATUS AND METHOD OF CONVEYING MASK AND WORK

(75) Inventors: Akira Morita, Tokyo (JP); Akira Nakazawa, Tokyo (JP)

(73) Assignee: Orc Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 10/617,816

(22) Filed: Jul. 14, 2003

(65) Prior Publication Data

US 2004/0046948 A1 Mar. 11, 2004

(30) Foreign Application Priority Data

Sep. 10, 2002 (JP) ........................................ 2002-264584

(51) Int. Cl.$^7$ .................... G03B 27/32; G03B 27/42; G03B 27/58; G03B 27/62
(52) U.S. Cl. ........................ 355/53; 355/72; 355/75; 355/77
(58) Field of Search ........................ 355/53, 72, 75, 355/77

(56) References Cited

U.S. PATENT DOCUMENTS

| 4,541,714 A | * | 9/1985 | Miyamoto | 355/99 |
| 4,677,303 A | * | 6/1987 | Erdman | 250/559.29 |
| 4,996,763 A | * | 3/1991 | Sano et al. | 29/593 |
| 5,031,334 A | * | 7/1991 | Takamura | 33/621 |
| 5,222,293 A | * | 6/1993 | Ozimek et al. | 29/833 |
| 5,329,126 A | * | 7/1994 | Amemiya et al. | 250/453.11 |
| 5,390,025 A | * | 2/1995 | Morita et al. | 356/400 |
| 5,563,682 A | * | 10/1996 | Aikawa et al. | 355/53 |

FOREIGN PATENT DOCUMENTS

JP          A-8-43950          2/1996

* cited by examiner

*Primary Examiner*—Rodney Fuller
(74) *Attorney, Agent, or Firm*—Liniak, Berenato & White

(57) ABSTRACT

An exposure apparatus includes a first transferring passage and a second transferring passage arranged at two different levels between a load/unload position and an exposure position, a first table and a second table one positioned in the load/unload position while the other positioned in the exposure position, a hoist mechanism which elevates one of the first and second tables to the first transferring passages, and lowers the other of the second and first tables to the second transferring passage, and a conveyor mechanism which transfers the first and second tables respectively to the load/unload position and the exposure position. Each of the first and second tables has a stage plate on which a work is placed, and a light-transmissible plate to which a mask is previously mounted.

20 Claims, 13 Drawing Sheets

EXPOSURE APPARATUS AND METHOD OF CONVEYING MASK AND WORK

FIELD OF THE INVENTION

The present invention relates to an exposure apparatus for use in exposure of plate-like works, such as printed circuit boards, and a method of conveying a mask and a work. The present invention particularly relates to an exposure apparatus and an exposing method for alternately aligning and exposing works in a load/unload position and an exposure position.

BACKGROUND OF THE INVENTION

In order to transfer images of a pattern of an electronic circuit onto a work such as a printed circuit board, a liquid crystal panel and a color filter for liquid crystal, a various exposure apparatus have been proposed to expose a work to light by radiating ultraviolet light having a predetermined wave length. Such exposure apparatus include so-called semiautomatic exposure apparatus wherein a work is manually loaded and unloaded by a worker and so-called automatic exposure apparatus wherein a work is automatically operated from load to unload of the work.

One example of a semiautomatic exposure apparatus is disclosed in Japanese Laid-open Patent Application No. 8-43950 (see columns [0043] to [0082]) and is explained with reference to FIG. 14. FIG. 14 is a schematic view of a conventional semiautomatic exposure apparatus. As shown in FIG. 14, a semiautomatic exposure apparatus 100 includes: a conveyor mechanism 103 which reciprocally conveys first and second tables 101, 102 for supporting a work between a load/unload position H1 and an under exposure position R1; a hoist mechanism 104 which elevates a support plate 101a (102a) of one table 101 (102), on which a work W and a mask M are placed, to an exposure position R2 after the table 101 (102) is carried by the conveyor mechanism 103 from the load/unload position H1 to the under exposure position R1, and lowers the other support plate 102a (101a), on which a work W and a mask M are placed, positioned in the exposure position R2 to the under exposure position R1 to place the support plate. 102a (101a) onto the table 102 (101); an upper frame 105 which sucks and supports one of the support plates 101a, 102a elevated by the hoist mechanism 104; a light-exposure mechanism 107 which radiates light such as ultraviolet light onto the upper frame 105 through an optical system 106; and imaging means 108, an alignment table 109 and a mask-support mechanism 110 arranged in the load/unload position H1.

In operation of the semiautomatic exposure apparatus (hereinafter referred to as an exposure apparatus) 100, the worker places a work W onto the support plate 101a of the first table 101 that is positioned in the load/unload position H1, and at the same time, the worker sets a mask M in conformity with the work W. The imaging means 108 pictures the alignment marks (not shown) of the mask M and the work W. When the work W is moved for alignment, the mask-support mechanism 110 sucks the mask M and displaces at least a part of the mask M for a certain distance from the work W, during which the alignment table 109 moves the support plate 101a for the purpose of alignment. The mask-support mechanism 110 is then lowered to superpose the mask M on the work W. If the both alignment marks (not shown) pictured by the imaging means 108 are within the allowable range, the alignment operation of the mask M and the work W is completed. The worker then fixes the mask M on the support plate 101a with the use of fixing means such as adhesive tapes.

Next, the conveyor mechanism 103 is actuated, so that the first table 101 in the load/unload position H1 is carried toward the under exposure position R1, while the second table 102 in the under exposure position R1 is carried toward the load/unload position H1. The hoist mechanism 104 elevates the support plate 101a of the first table 101 that is carried in the under exposure position R1 so that the support plate 101a mates with the upper frame 105 arranged in the exposure position R2 with the aid of vacuum. The light-exposure mechanism 107 then radiates light through the optical system 106 to the mask M and the work W that are sandwiched between the upper frame 105 and the support plate 101a, so that the images of the pattern of the mask M are transferred onto the work W.

After the exposure operation is completed, the vacuum seal between the upper frame 105 and the support plate 101a is disengaged, and the work W and the mask M are released from the upper frame 105. The work W and the mask M are received by the hoist mechanism 104 in a manner to be placed onto the support plate 101a, and are lowered to the first table 101 positioned in the under exposure position R2 by the lowering motion of the hoist mechanism 104.

During the exposure operation, the alignment operation of a work W and a mask M are carried out in the load/unload position H1 relative to the second table 102 in a manner similar to the alignment operation on the fist table 101.

Therefore, the alignment operation is carried out at one of the first and second tables 101, 102 positioned in the load/unload position H1, while the exposure operation is carried out in the exposure position R2 relative to the other second and first tables 102, 101 positioned in the under exposure position R1, so that the alignment operation and the exposure operation are alternately and repeatedly carried out. It should be noted that the first table 101 and the second table 102 are positioned in a different height at the under exposure position R1. However, the support plates 101a, 102a of the fist and second table 101, 102 can engage with and disengage from the upper frame 105 by way of varying the stroke length (hoist distance) of the hoist mechanism 104.

In another known exposure apparatus, the exposure operation is carried out in the underexposure position R1 of the semiautomatic exposure apparatus 100. In this exposure apparatus, both tables are constructed such that a light-transmissible plate which retains a mask is opened and closed to allow a work to be set in a position facing to the mask. In this exposure apparatus, a suitable exposure operation is carried out for a work on both tables that are alternately transferred in a different height of the underexposure position, by way of varying the exposure time relative to the respective tables.

However, the conventional exposure apparatus have the following drawbacks.

(1) Since the support plate to be alternately transferred by the first and second tables and separated from the tables is elevated through the hoist mechanism so as to set a work in the exposure position with the work mating with the upper frame, it is difficult to retain the alignment position between the work and the mask until they are set in the exposure position. Further, since both tables are carried at different height levels in the load/unload position, the alignment operation has to be carried out at different height levels. This requires a further operational control when compared with the alignment operation carried out on the alignment table at the same height.

(2) Since a metal frame is provided in a manner surrounding the light-transmissible plate that is adjacent to the mask, a setting operation of the light-transmissible plate is required whenever the light-transmissible plate is replaced or initially set up.

(3) During the alignment operation of the mask and the work, the work is moved for alignment while the mask is retained by the mask-support mechanism 110. However, this requires a complicated structure. Further, the worker fixes the mask and the work by means of adhesive tapes, leading to increased number of operations of the worker.

(4) At the time of alignment of the mask with the work, the worker has to set both the mask and the work, which makes the load/unload operation complicated. In the exposure apparatus of the type in which the light-transmissible plate can be open and closed for the placement of a work, the open/close motion of the light-transmissible plate requires a great effort for the worker, and further, the imaging means has to be retracted so as not to bump against the light-transmissible plate during the open/close motion of the light-transmissible plate.

(5) The conventional exposure apparatus includes a mechanism which alternately carries both tables between the load/unload position and the exposure position through the two transferring passages arranged one on top of the other, and a mechanism which separates the tables from the conveyor mechanism to carry out the alignment operation and the exposure operation at the load/unload position and the exposure position, respectively. Therefore, the conventional exposure apparatus requires the control of the vertical movement of the support plate as well as a large driving force to move the support plate.

In view of the above, the present invention seeks to provide an exposure apparatus and an exposing method wherein the alignment position and the exposure position of the works are substantially the same in height direction, and wherein the metal frame surrounding the light-transmissible plate can be omitted, and wherein the operation of the light-transmissible plate where a mask is set is readily performed.

SUMMARY OF THE INVENTION

According to a first aspect of the invention, there is provided an exposure apparatus comprising:

a first table and a second table each including a stage plate on which a work is placed, and a light-transmissible plate to which a mask is previously mounted, the first and second tables being transferred alternately between a load/unload position where the work is loaded/unloaded and aligned with the mask and an-exposure position where the aligned set of work and mask is exposed to light;

a first transferring passage and a second transferring passage arranged at two different levels between the load/unload position and the exposure position, wherein the first transferring passage transfers the first table and the second table alternately, while the second transferring passage transfers the second table and the first table alternately;

a hoist mechanism which elevates one of the first and second tables to the first transferring passages, and lowers the other of the second and first tables to the second transferring passage;

a conveyor mechanism which conveys the first and second tables elevated or lowered by the hoist mechanism along the first and second transferring passages, one from the load/unload position to the exposure position, and the other from the exposure position to the load/unload position;

an alignment mechanism which aligns the work that is placed on one of the tables conveyed to the load/unload position with the mask; and a light-exposure mechanism which radiates light to the work placed on the other of the tables conveyed to the exposure position.

With this construction of the exposure apparatus, after completing the exposure operation and the alignment operation of the first and second tables, in the case where the first transferring passage is positioned upward of the second transferring passage, the first table is elevated to the first transferring passage by the hoist mechanism and the second table is lowered to the second transferring passage by the hoist mechanism. The first table and the second table each supporting the mask and the work are alternately transferred to the load/unload position and the exposure position through the conveyor mechanism. One of the load/unload position and the exposure position may be arranged on the first transferring passage or on the second transferring passage, and the other may be arranged on the second transferring passage or on the first transferring passage. Further, because the mask is set to the light-transmissible plate of each table, the alignment mechanism directly pictures the alignment marks of the mask and the work.

In the aforementioned exposure apparatus, the hoist mechanism engages with the first and second tables, respectively, through hoist guide means, and the conveyor mechanism conveys the first and second tables by drive means which is engageable with the hoist guide means.

With this construction of the exposure apparatus, a work is placed on the stage plate of the first table at the load/unload position, and by the alignment mechanism the work is aligned with the mask that is set on the light-transmissible plate. When doing so, by the light-exposure mechanism the exposure operation is applied to the second table that has been transferred to the exposure position after completing the alignment operation. After the alignment operation of the first table and the exposure operation of the second table are completed, the first table is elevated to the first transferring passage by the hoist mechanism and through the hoist guide means and the second table is lowered to the second transferring passage by the hoist mechanism and through the hoist guide means. Thereafter, the first and second tables are transferred along the respective transferring passages with the hoist guide means being transferred by the drive means of the conveyor mechanism, so that the first table is transferred to the exposure position and the second table is transferred to the load/unload position.

According to a second aspect of the invention, there is provided a method of conveying a mask and a work, in which a first table to which a mask and a work are set is conveyed from a fist position to a second position via a fist transferring passage, while a second table to which a mask and a work are set is conveyed from the second position to the first position via a second transferring passage, the method comprising the steps of:

aligning the mask and the work on the first table at the first position, while exposing the work on the second table to light through the mask at the second position; and conveying the first table and the second table in an endless manner along a loop, which extends across the first and second positions and includes the first and second transferring passages.

With this method, the first table and the second table are conveyed along the loop in an endless manner. This achieves effective utilization of the limited inner space of the exposure apparatus as well as provides a smaller-sized exposure apparatus.

BRIEF DESCRIPTION OF THE DRAWINGS

A preferred embodiment of the present invention will be described below, by way of example only, with reference to the accompanying drawings, in which:

FIGS. 9A-1 through 9D-2 are schematic views explaining a hoisting operation and a conveying operation of the exposure apparatus;

FIGS. 12A-1 through 12D-2 are schematic views illustrating structures of a light-transmissible plate and a stage plate of the tables in the transferring passages;

DESCRIPTION OF THE PREFERRED EMBODIMENT

With reference to the accompanying drawings, one preferred embodiment of the present invention will be described. Herein, as one example of the present invention, an exposure apparatus is of the type exposing one side of a substrate.

Figure 1:
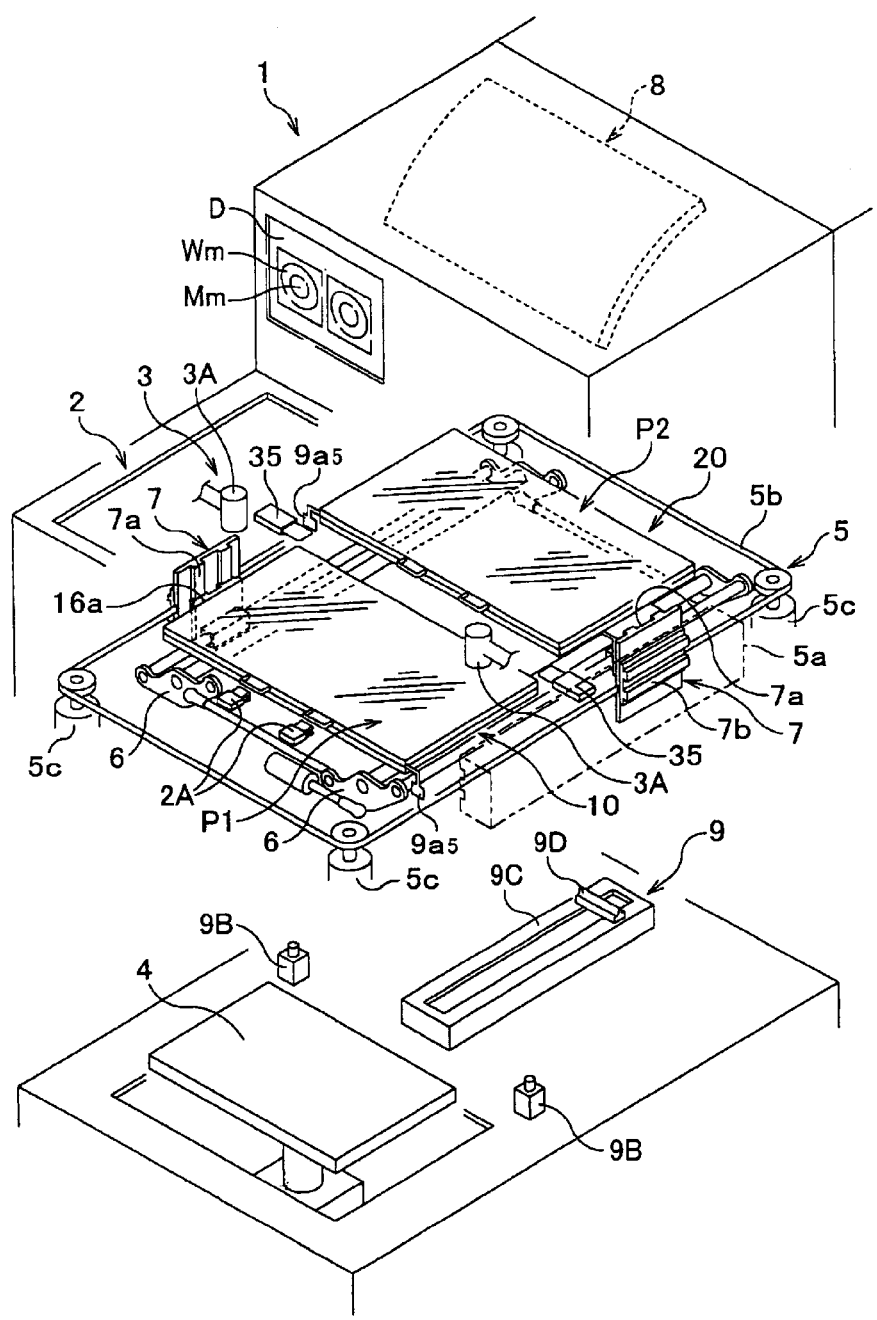
FIG. 1 is an exploded perspective view of an exposure apparatus according to the present invention, schematically illustrating the whole arrangement of the exposure apparatus.
Figure 2:
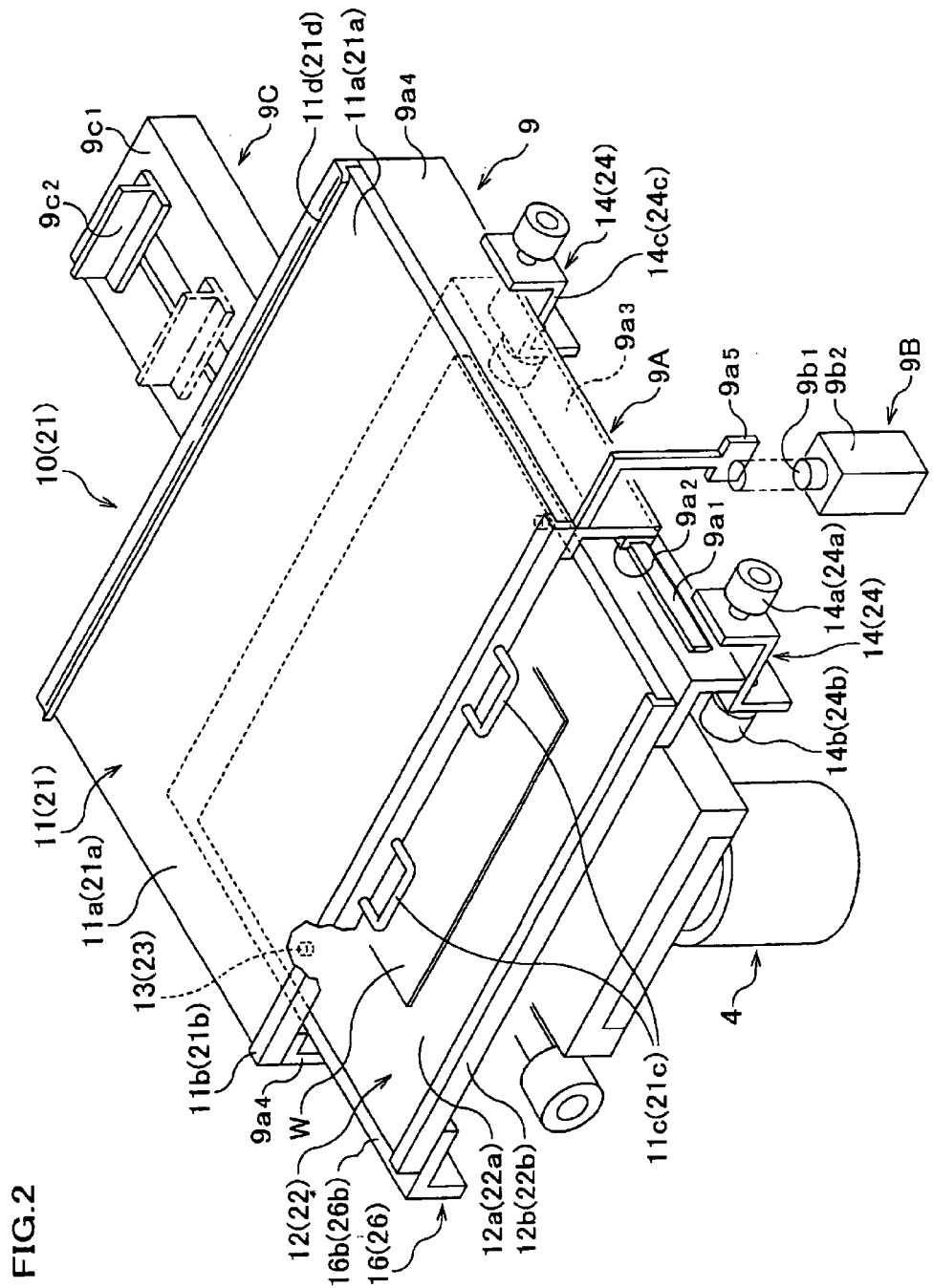
FIG. 2 is a perspective view illustrating a structure of a first table (second table) of the exposure apparatus.
Figure 6:
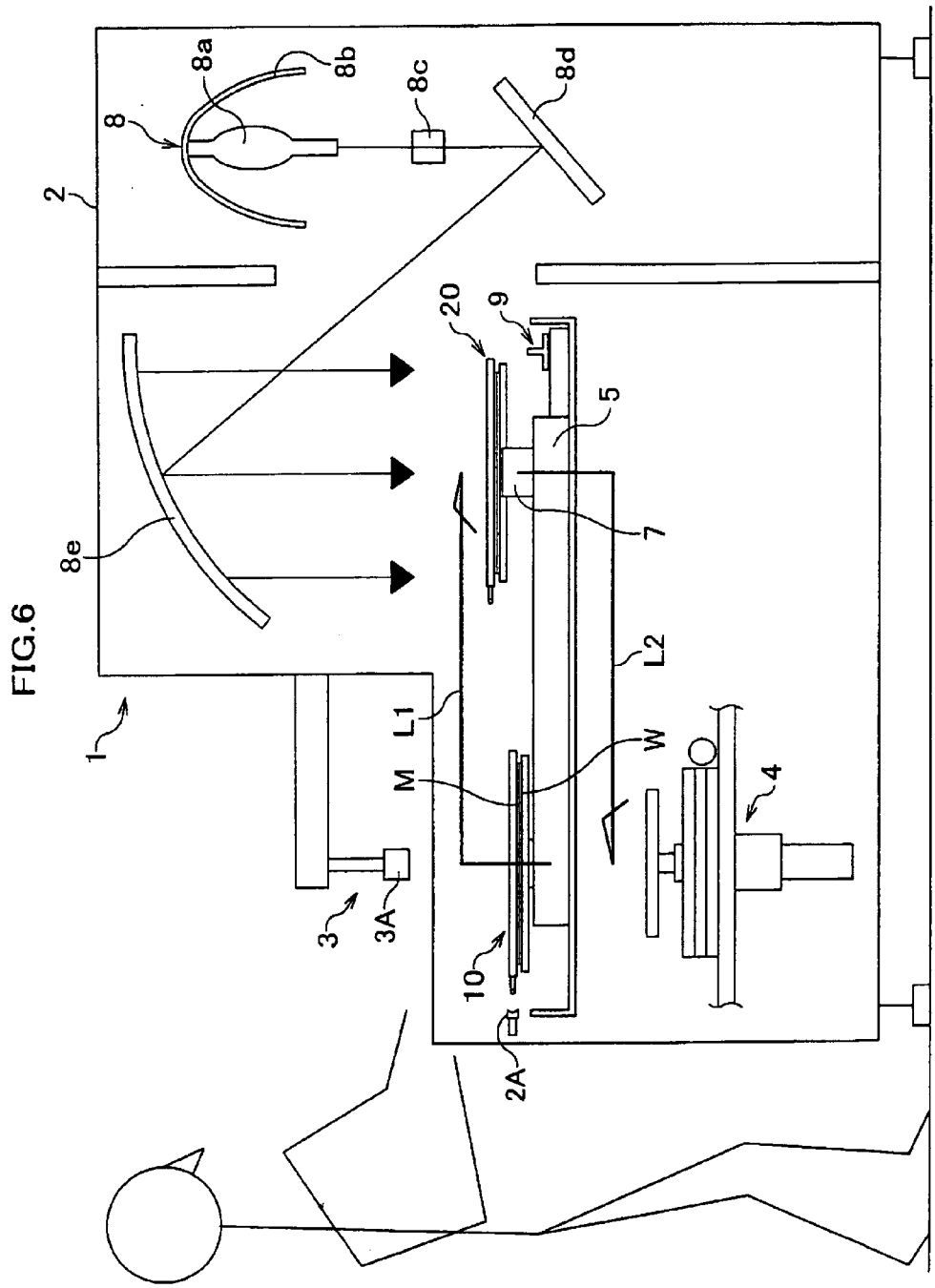
FIG. 6 is a schematic view illustrating the whole arrangement of the exposure apparatus.

As shown in FIGS. 1, 2 and 6, an exposure apparatus 1 provides a load/unload position P1 as a first position where a worker loads or unloads a work W in front of a housing 2 and an exposure position P2 as a second position where a work W is exposed to light at the back of the housing 2.

The exposure apparatus 1 includes: a first transferring passage L1 and a second transferring passage L2 arranged at two different levels between the load/unload position P1 and the exposure position P2 such that the first and second transferring passages L1, L2 form a part of a loop passing through the first position P1 and the second position P2; a first table 10 and a second table 20 respectively transferred along the first and second transferring passages L1, L2 in an endless manner (FIG. 6); a conveyor mechanism 5 which conveys the two tables 10, 20 respectively along the two transferring passages L1, L2; a hoist mechanism 6 which elevates and lowers the two tables 10, 20 respectively positioned in the load/unload position P1 and the exposure position P2 so as to switch their transferring passages; a light-transmissible plate slide mechanism 9 which slidably opens and closes a light-transmissible plate 11 (21) and a stage plate 12 (22) of the first table 10 (or the second table 20) when one of the tables 10, 20 is transferred from the exposure position P2 to the load/unload position P1; imaging means 3A and an alignment table 4 as an alignment mechanism 3 provided in the load/unload position P1; and a light-exposure mechanism 8 which radiates light including ultraviolet rays and arranged in the exposure position P2. The light-transmissible plate slide mechanism 9 consists of slide means 9A, slide actuation means 9B, and light-transmissible plate guiding means 9C. As shown in FIG. 6, the loop is rectangular with the first transferring passage L1 vertically arranged on top of the second transferring passage L2. The first table 10 and the second table 20 are moved along the loop in an endless manner as illustrated in FIG. 6.

Structures of the first table 10 and the second table 20 are described. Because the first table 10 and the second table 20 are substantially the same in structure except that right and left parts thereof positioned symmetrically with respect to the conveying direction of the tables, only the structure of the first table 10 will be described and description of the second table 20 will be omitted.

As shown in FIGS. 1 and 2, the first table 10 includes: a frame member 16 with a U-shaped outer profile and having a mid space through which the alignment table 4 for positioning a work W supports the stage plate 12; the light-transmissible plate 11 and the stage plate 12 remotely and oppositely supported by the light-transmissible plate slide mechanism 9 and the frame member 16; the slide means 9A which slidably supports the light-transmissible plate 11 relative to the frame member 16; a conveyor roller 14 provided at one of right and left sides with respect to the conveying direction of the frame member 16; and an engage portion 16a provided at a side of the frame member 16 in a position opposite to the conveyor roller 14.

As shown in FIGS. 1 and 2, the light-transmissible plate 11 includes: a plate member 11a made of a material that allows transmission of a certain wave length of ultraviolet rays, such as acrylic plate, quartz glass plate, or synthetic glass plate; a front plate-support member 11b provided at a front side of the plate member 11a (at one side that faces the front when the plate member 11a is conveyed from the exposure position to the load/unload position); and positioning protrusions 11c fixed to and horizontally extending from the front plate-support member 11b. The positioning protrusions 11c of the upper light-transmissible plate 11 are positioned equidistantly along the length of the front plate-support member 11b. Each of the positioning protrusions 11c is made of a U-shaped steel frame with a circular cross-section at an area abutting to an abutting member 2A to be described later.

Two positioning protrusions 11c are provided in this preferred embodiment. However, only one positioning protrusion or more than three positioning protrusions may be provided. The positioning protrusions 11c also functions as a handle so that a worker can grip the handle and remove the light-transmissible plate 11 from the first table 10.

As shown in FIG. 2, a rear plate-support member 11d is fixed to a plate receiving member 9a4 of the slide means 9A at the rear of the plate receiving member 9a4. The light-transmissible plate 11 is placed on the plate receiving member 9a4 with its rear side (opposite to the front plate-support member 11b) engaged with the rear plate-support member 11d. The rear plate-support member 11d curves upward in a shape readily engageable with the rear side of the light-transmissible plate 11a.

Figure 4:
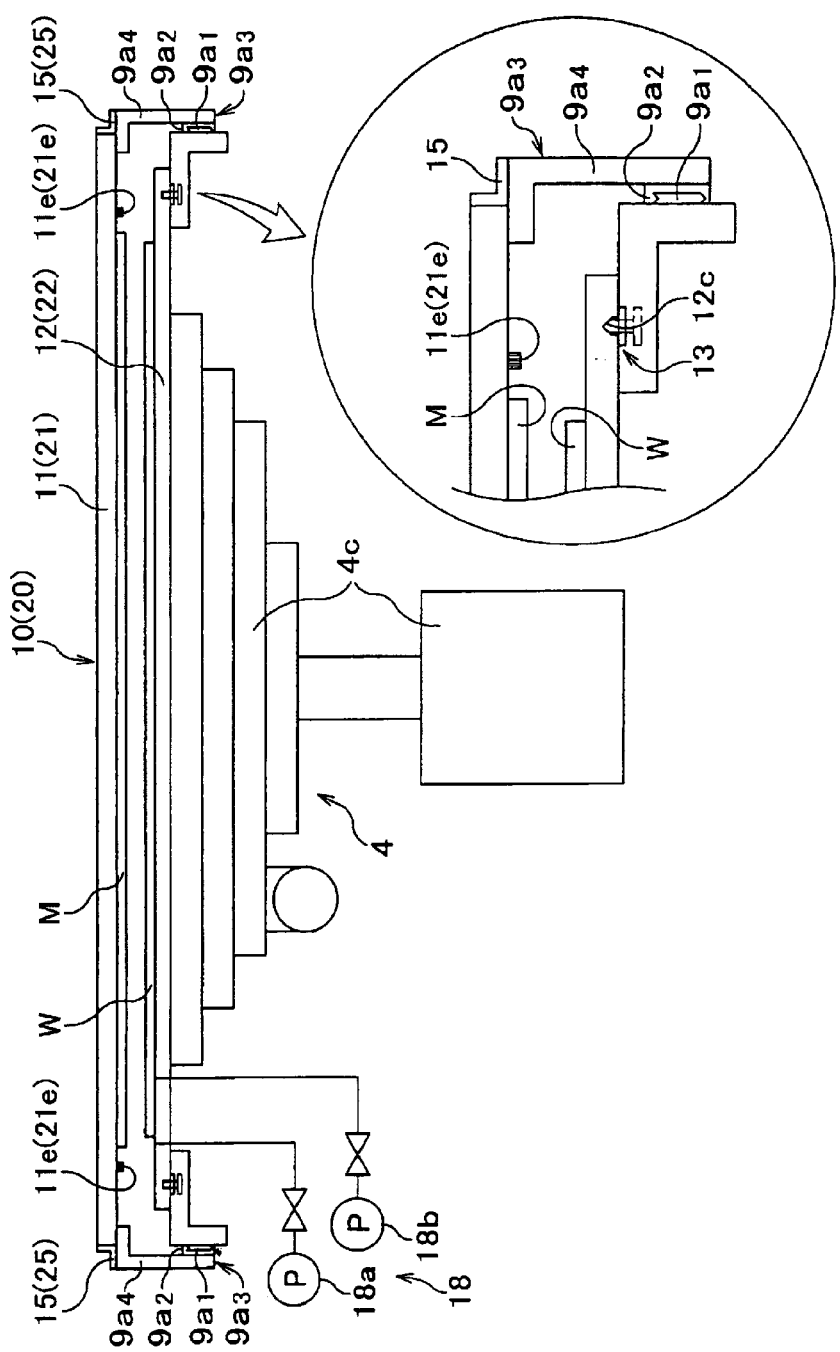
FIG. 4 is a schematic view showing a structure of an alignment table of the exposure apparatus.

The rear plate-support member 11d extends along the rear side of the light transmissible plate 11a. However, as long as firmly engageable with the light-transmissible plate 11a and is placed on the plate receiving member 9a4, the length and the depth of the rear plate-support member 11d that engages with the light-transmissible plate 11a may vary. As shown in FIG. 4, along the conveying direction of the table, both sides of the light-transmissible plate 11a are guided by L-shaped restriction member 15. The light-transmissible plate 11 is constructed so that the worker can hold the positioning protrusions 11c and readily pull out the light-transmissible plate 11 from the rear plate-support member 11d.

As shown in FIG. 2, the slide means 9A slides the light-transmissible plate 11 along the conveying direction with the light-transmissible plate 11 placed thereon. The slide means 9A includes: slide projections 9a1 as slide means provided on both sides of the frame member 16; slide guides 9a2 engageable with and slidably guiding the slide projections 9a1; slide frame 9a3 to which the slide guides 9a2 are fixed and through which the work W and the mask M are exposed to light; the plate receiving member 9a4 formed on the top surface of the slide frame 9a3 and for placing the light-transmissible plate 11; a stopper plate 9a5 laterally extending with respect to the conveying direction of the slide frame 9a3; and the rear plate-support member 11d fixed to the rear end of the plate receiving member 9a4.

As shown in FIGS. 2 and 4, the slide frame 9a3 has a sufficient height such that the light-transmissible plate 11 is slidable relative to the stage plate 12 supported on the frame member 16 with the mask M and the work W set on the light-transmissible plate 11 and the stage plate 12.

The stopper plate 9a5 slides the slide frame 9a3 along the slide projections 9a1 when the stopper plate 9a5 abuts against an abutment stop 9b1 positioned along the second transferring passage L2 (FIG. 6). The stopper plate 9a5 is provided at the front side of the slide frame 9a3 with respect to the conveying direction from the exposure position P2 to the load/unload position P1. Shape and position of the stopper plate 9a5 may vary as long as it can slide the slide frame 9a3.

As shown in FIGS. 2 and 4, the stage plate 12 of the first table 10 is placed on the plate support portion formed on the frame member 16 and has excellent characteristics in flatness. The stage plate is provided with a resin plate 12a, and recess portions 12c formed on the peripheral part of the resin plate 12a. The stage plate 12 is placed on the frame member 16 with a front frame 12b crossing across the frame member 16. The front frame 12b restricts contraction of the stage plate 12.

The recess portions 12c of the stage plate 12 engage with guide pins (guide means) 13 projecting from the plate support portion of the frame member 16, so that the stage plate 12 is always retained in a predetermined position. As shown in FIG. 4, the recess portion 12c has an inclined surface at the opening thereof or the guide pin 13 has an inclined surface from the apex to the peripheral edge. This facilitates the positioning of the stage plate 12 when the exposure operation is completed and the vacuum sucking of the stage plate 12 against the light-transmissible plate 11 is disengaged. When the stage plate 12 is disengaged from the light-transmissible plate 11 and drops on the frame member 16, the stage plate 12 is guided in the predetermined position with the guide pins 13 inserted into the recess portions 12c.

As shown in FIGS. 2 and 4, the frame member 16 of the first table 10 remotely and oppositely supports the stage plate 12 with respect to the light-transmissible plate 11. The frame member 16 includes a plate support portion 16b for receiving the stage plate 12. As seen in FIG. 9A-1, the frame member 16 is provided with the engage portion 16a at the center of one side along the conveying direction. The engage portion 16a engages with a hoist guide 7 of the hoist mechanism 6 to be described later, and a first hoist rod 6f1 of the hoist mechanism 6 is fixed to the engage portion 16a.

Figure 7:
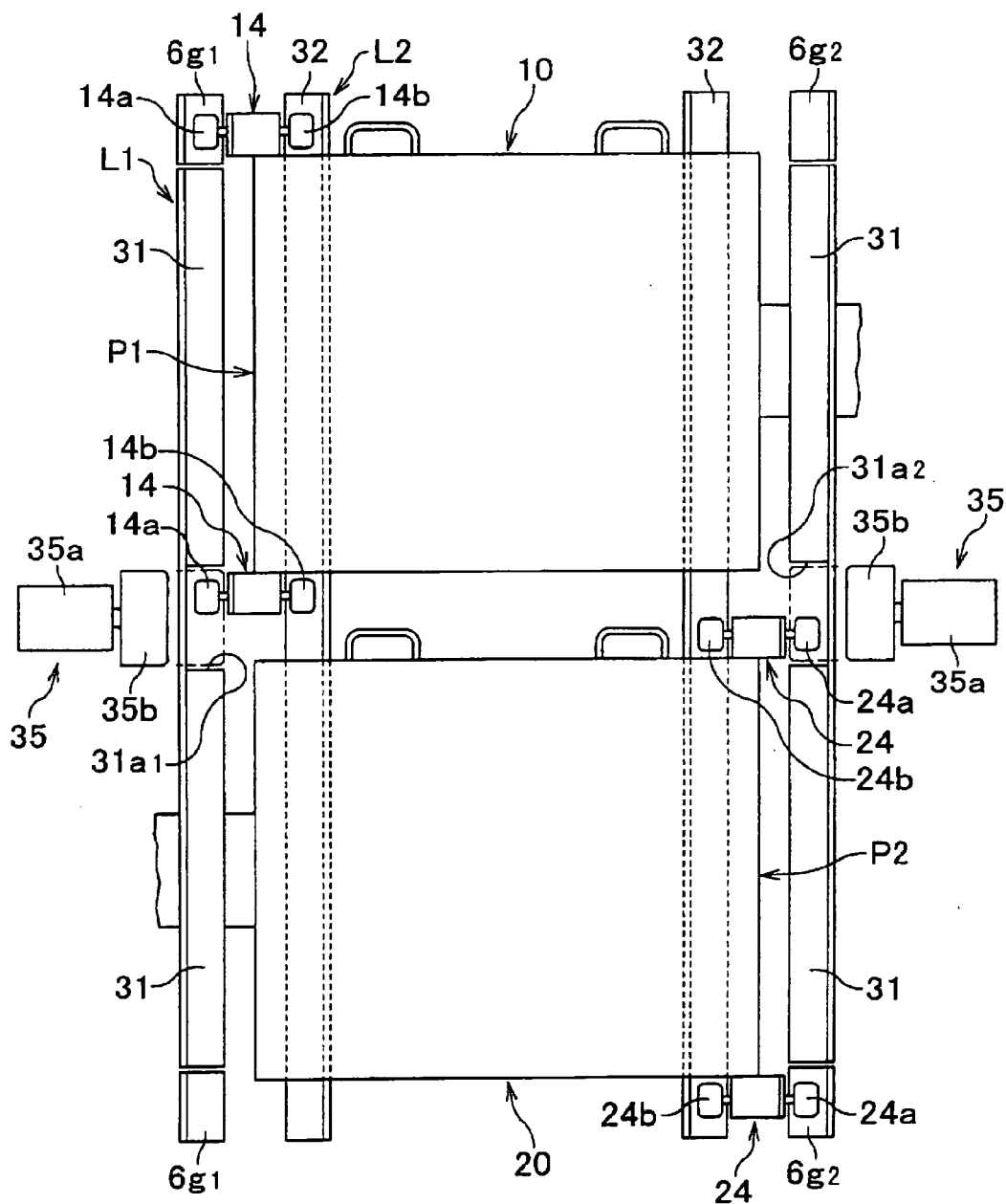
FIG. 7 is a plan view illustrating structures of two transferring passages of the exposure apparatus.
Figure 11:
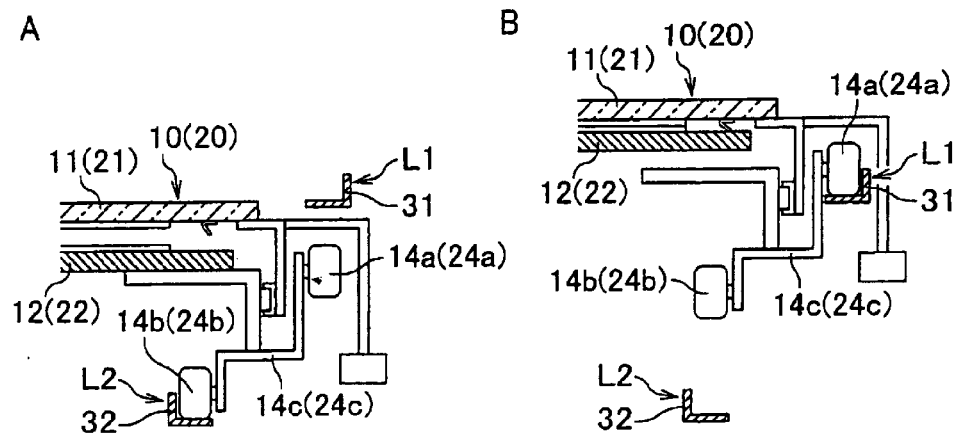
FIGS. 11A and 11B are schematic views showing two tables of the exposure apparatus respectively arranged in the transferring passages.

As shown in FIGS. 2 and 7, the conveyor rollers 14 are arranged opposite to the engage portion 16a at two positions aligned along the conveying direction. Each conveyor roller 14 consists of an upper roller 14a and a lower roller 14b, both supported by an angle plate 14c. As best seen in FIG. 11, the upper roller 14a moves along the first transferring passage L1 while the lower roller 14b does not contact on the first transferring passage L1. Meanwhile, the lower roller 14b moves along the second transferring passage L2 while the upper roller 14a does not contact on the second transferring passage L2.

Figure 8:
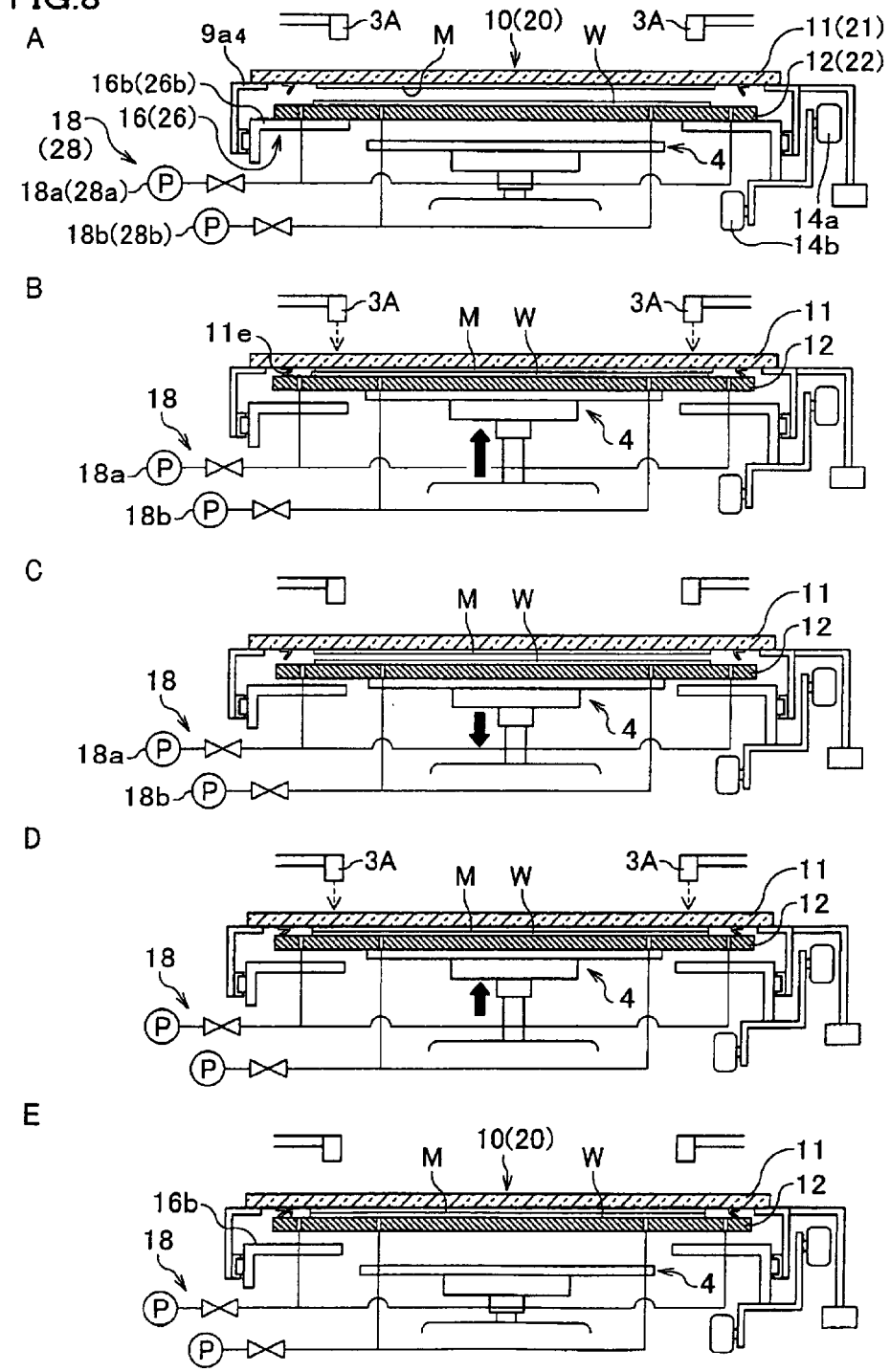
FIGS. 8A through 8E are schematic views explaining an alignment operation of the exposure apparatus.

As shown in FIG. 8, the suction mechanism 18 detachably sucks the work W on the stage plate 12 against the mask M set on the light-transmissible plate 11. The suction mechanism 18 includes main suction means 18a which sucks the mask M and the work W through the light-transmissible plate 11, the stage plate 12 and a peripheral seal (seal rubber) 11e, and work suction means 18b which retains the work W on the stage plate 12.

When the worker sets a work W on the stage plate 12 in the load/unload position P1 (FIG. 9), the work suction means 18b actuates and suctions the work W against the stage plate 12. The main suction means 18a actuates when the mask M and the work W are sucked in an abutting manner.

With reference to FIG. 2, the light-transmissible plate slide mechanism 9, which consists of the slide means 9A, the slide actuation means 9B, and the light-transmissible plate guiding means 9C, will be described below. Because the slide means 9A has been described previously, descriptions will be made on the slide actuation means 9 B and the light-transmissible plate guiding means 9C.

As shown in FIG. 2, the slide actuation means 9B includes: an abutment stop 9b1 positioned along the second transferring passage L2 (FIG. 6) and protruding into and away from the sliding locus of the stopper plate 9a5; and a drive portion 9b2 for moving the abutment stop 9b1 toward and away from the stopper plate 9a5. The slide actuation means 9B is arranged along the second transferring passage L2 in a position corresponding to one side of the conveying direction of the first and second tables 10, 20. The stopper plate 9a5 extends perpendicularly of the conveying direction of the conveyer rollers 14 and away from the conveying direction thereof.

Figure 3:
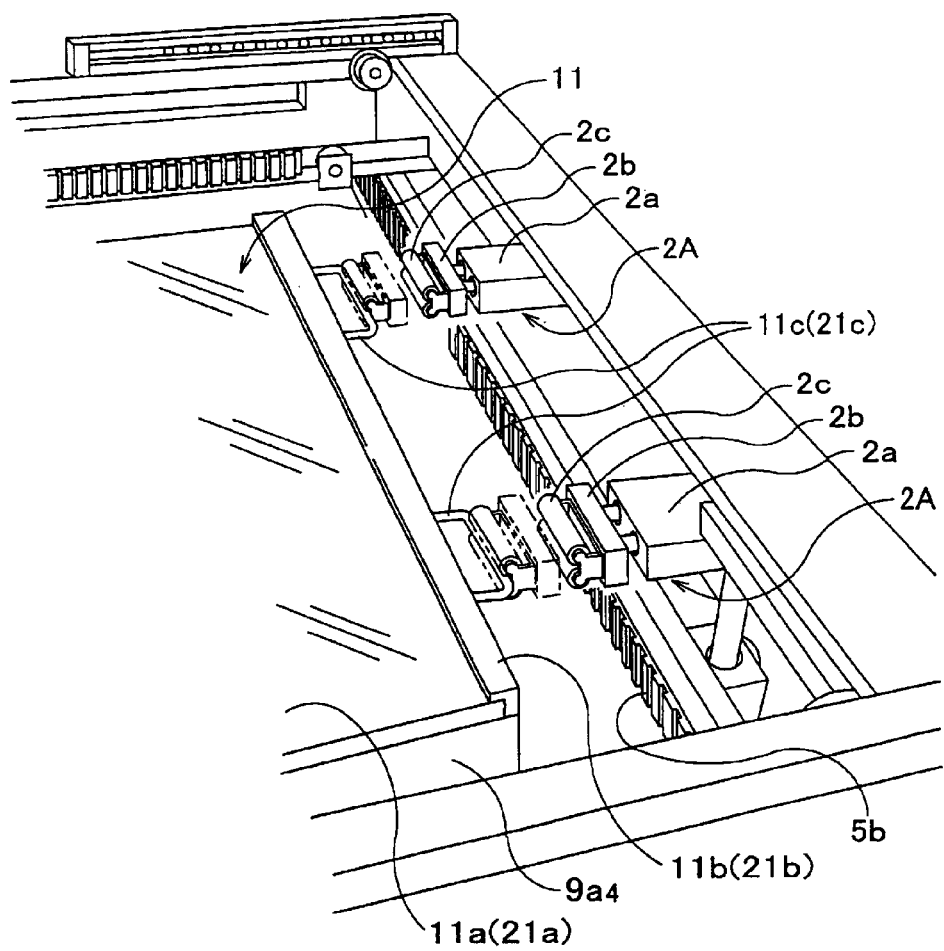
FIG. 3 is a perspective view illustrating an abutting reference position in a load/unload position of the exposure apparatus.

As shown in FIG. 2, the light-transmissible plate guiding means 9C includes: light-transmissible plate conveying/driving means 9c1 that is arranged along the second transferring passage L2 and downward of the first table 10 or the second table 20 conveyed along the second transferred passage L2; and light-transmissible plate push guide means 9c2 that is driven by the light-transmissible plate conveying/driving means 9c1 and guides the light-transmissible plate 11 toward the load/unload position P1 with being engaged with the rear plate-support member 11d of the light-transmissible plate 11. Herein, the light-transmissible plate push guide means 9c2 of the light-transmissible plate guiding means 9C also functions as push guide means for guiding the positioning protrusions 11c of the light-transmissible plate 11 against the abutting member 2A (FIG. 3). The light-transmissible plate push guide means 9c2 may be formed so as to rise when it pushes the rear plate-support member 11d and retract after the push/guide operation is completed.

With reference to FIGS. 1 and 2, the imaging means 3A, the alignment table 4, and the abutting member 2A as the alignment mechanism 3 provided in the load/unload position P1 will be described below.

The alignment mechanism 3 includes: the imaging means 3A such as a CCD camera; and the alignment table 4 which calculates positions of the alignment marks Mm, Wm of the mask M and the work W pictured by the imaging means 3A to work out the distance of the work W required for alignment and then moves the work W for alignment. In order to ensure a good visibility of the marks Mm, Wm, the imaging means 3A utilizes illumination which does not accelerates the exposure operation upon picturing the alignment marks Mm, Wm. The imaging means 3A preferably radiates a laser beam as a mark for indicating a predetermined position where a work W is placed on the stage plate 12. A display D is positioned above the load/unload position P1 so that the worker can visually check the image pictured by the imaging means 3A.

Figure 5:
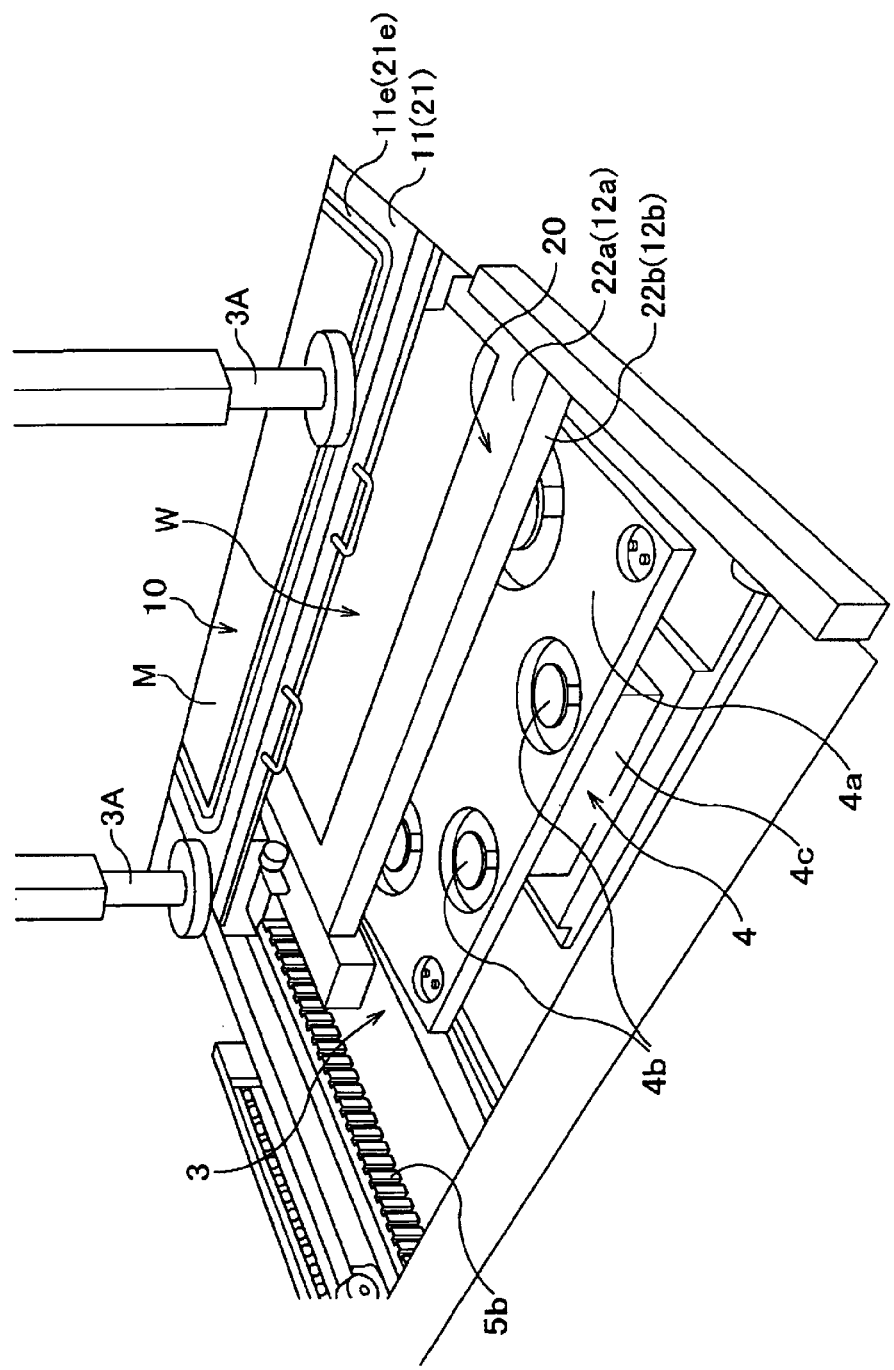
FIG. 5 is a perspective view illustrating a structure of the alignment table in the load/unload position of the exposure apparatus.

As shown in FIGS. 1 and 5, the alignment table 4 includes: an alignment/placement table 4a for placing the stage plate 12; sucking pads 4b which move through holes of the alignment/placement table 4a and suck the stage plate 12 under vacuum on the alignment/placement table 4a; and an alignment/drive portion 4c which moves the stage plate 12 sucked by the sucking pads 4b and retained on the alignment/placement table 4a in the Z axis direction (upward/downward direction), the X axis and Y axis directions (horizontal directions perpendicular to the Z axis), and the θ direction (rotational direction around the Z axis).

As shown in FIG. 3, the abutting member 2A includes: two abutment positioning portions 2c to be guided toward and away from the positioning protrusions 11c of the light-transmissible plate 11 positioned in the second transferring passage L2; two base portions 2b each supporting the abutment positioning portion 2c; and two drive portions 2a each fixed to the base portion 2b and guiding the abutment positioning portion 2c toward and away from the corresponding positioning protrusion 11c. Each positioning portion 2c has two tubular surfaces arranged on one top of the other and rotatably supported by the base portion 2b. The positioning portions 2c may have any known shape, as long as they can stop the positioning protrusions 11c at a predetermined position. In this preferred embodiment, the abutting members 2A are retracted until the light-transmissible plate 11 is conveyed to the end position of the load/unload position P1 (FIG. 6) and are advanced by the drive portions 2a toward the positioning protrusions 11c at the time of completing the conveying operation of the light-transmissible plate 11 to the load/unload position P1.

Next, the hoist guide 7, the conveyor mechanisms 5, and the hoist mechanism 6 will be described below.

As shown in FIG. 1, the hoist guide 7 includes: a slide portion 7a engageable with the engage portion 16a, 26a of the first and second tables 10, 20 and sliding the table 10, 20; and a slide engaging portion 7b provided on the reverse side of the slide portion 7a and slidably engaging with the conveyor mechanism 5. The hoist guide 7 is attached to a drive belt 5b as drive means of the conveyor mechanism 5 at a predetermined position.

Figure 13:
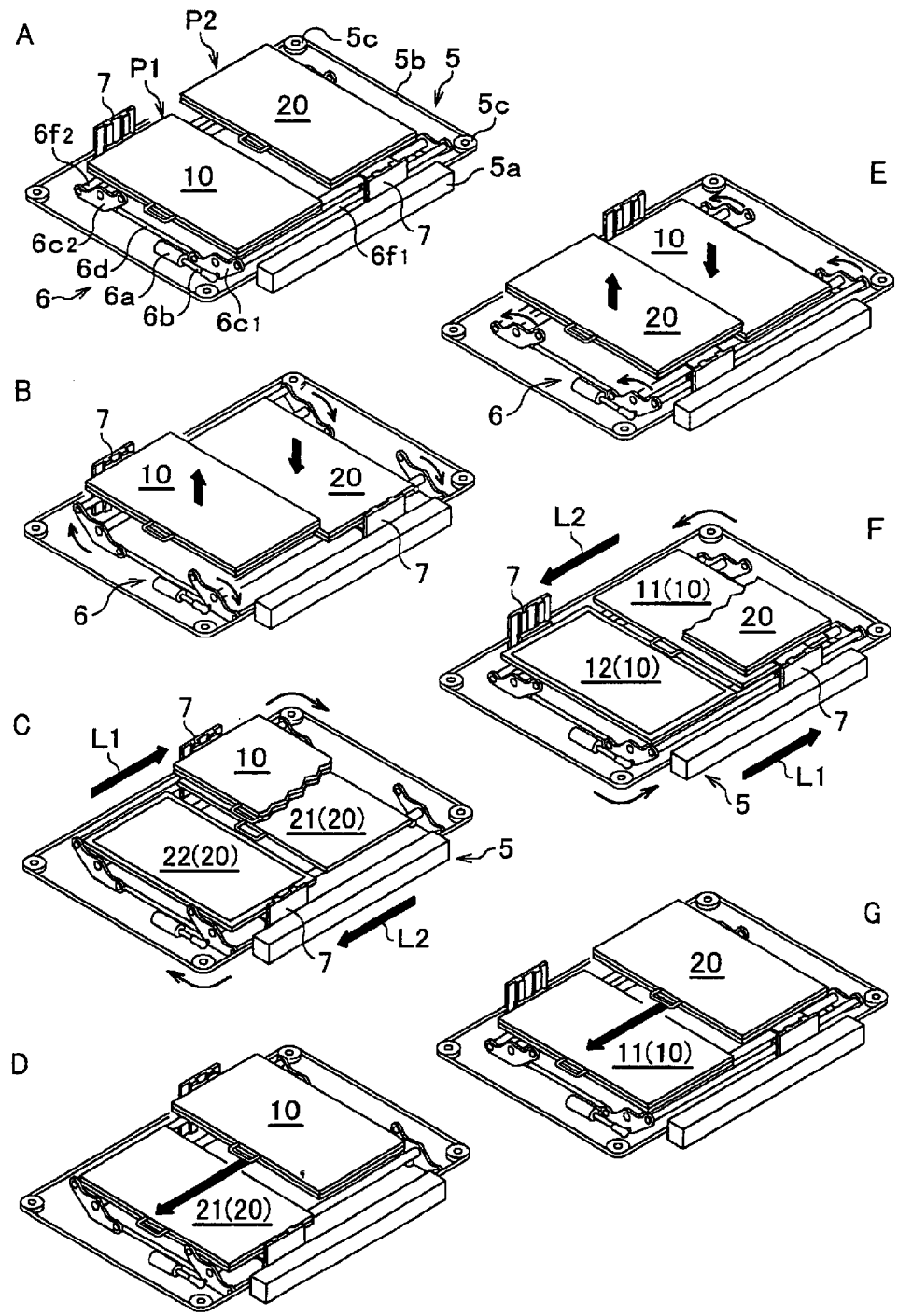
FIGS. 13A through 13G are schematic views illustrating the whole operations of the tables of the exposure apparatus.
Figure 14:
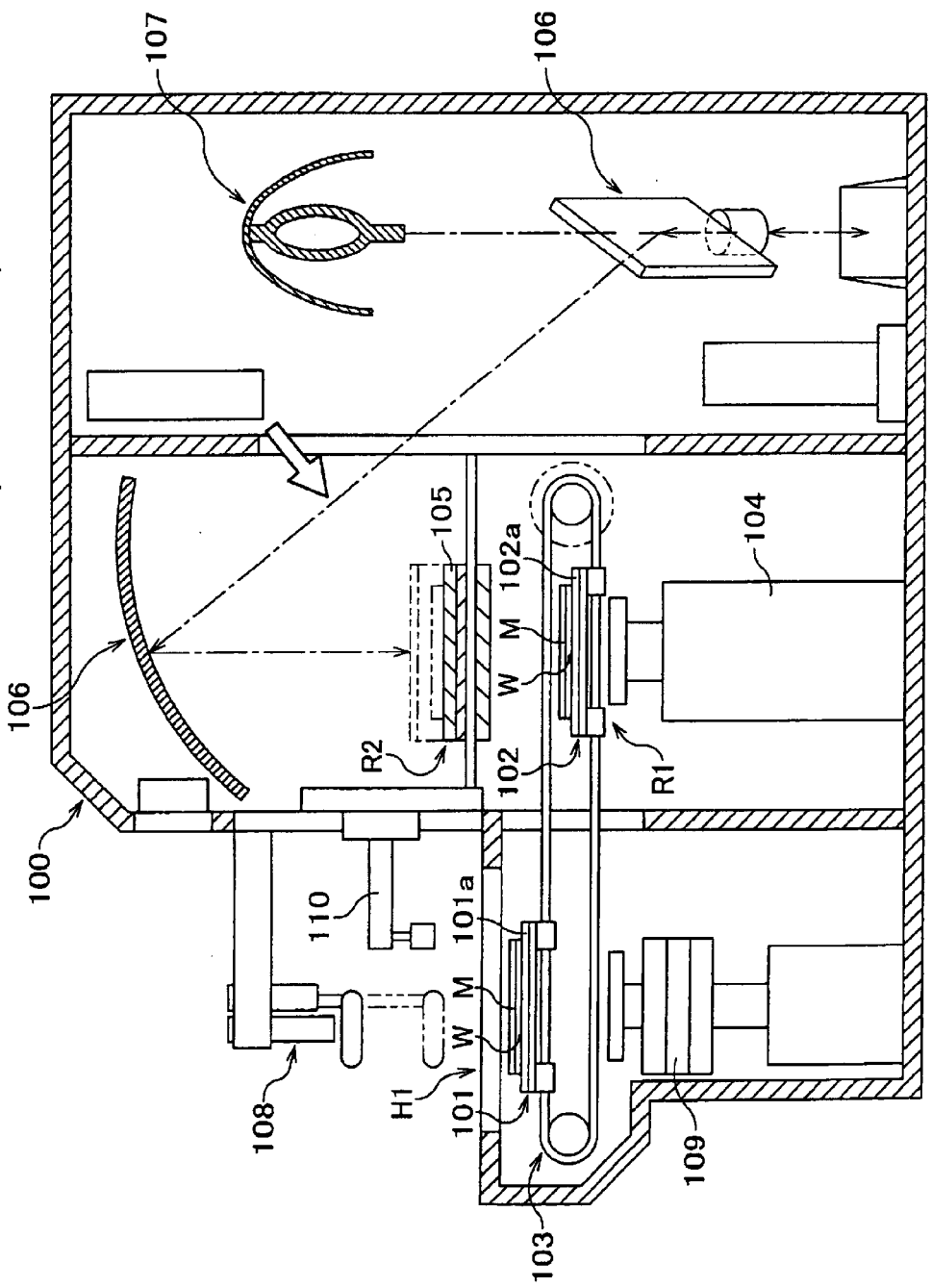
FIG. 14 is a schematic view illustrating the whole arrangement of a conventional exposure apparatus.

As best seen in FIGS. 1 and 13, the conveyor mechanism 5 includes: the drive belt 5b surrounding the load/unload position P1 and the exposure position P2; belt guides 5c supporting the drive belt 5b at a certain height level and guiding the movement of the drive belt 5b; and a conveyor actuator 5a which holds one of the hoist guides 7 and reciprocates the same to drive the drive belt 5b.

The drive belt 5b is an endless belt which is provided with rugged surface facing to the belt guides 5c and formed in a certain interval (FIG. 5). Each belt guide 5c has gears engageable with the rugged surface of the drive belt 5b and guiding the drive belt 5b. A linear guide 5d is fixed to the housing 2 in the position opposite to and remote from the conveyor actuator 5a in a manner engaging with the slide engaging portion 7b of the hoist guide 7 and reciprocally guiding the hoist guide 7. The conveyor actuator 5a may be of any known mechanism such as LM guide, hydraulic cylinder, pneumatic cylinder, and feed screw mechanism, as long as it retains the hoist guide 7 and reliably reciprocates the same.

Instead of providing a conveyor actuator 5a at one side, it is possible to provide conveyor actuators 5a at both sides of the conveying direction of the tables 10, 20 in a synchronized or unsynchronized manner. In the instance where two conveyor actuators 5a are provided, the drive belt 5b and the belt guides 5c are not required.

Figure 10:
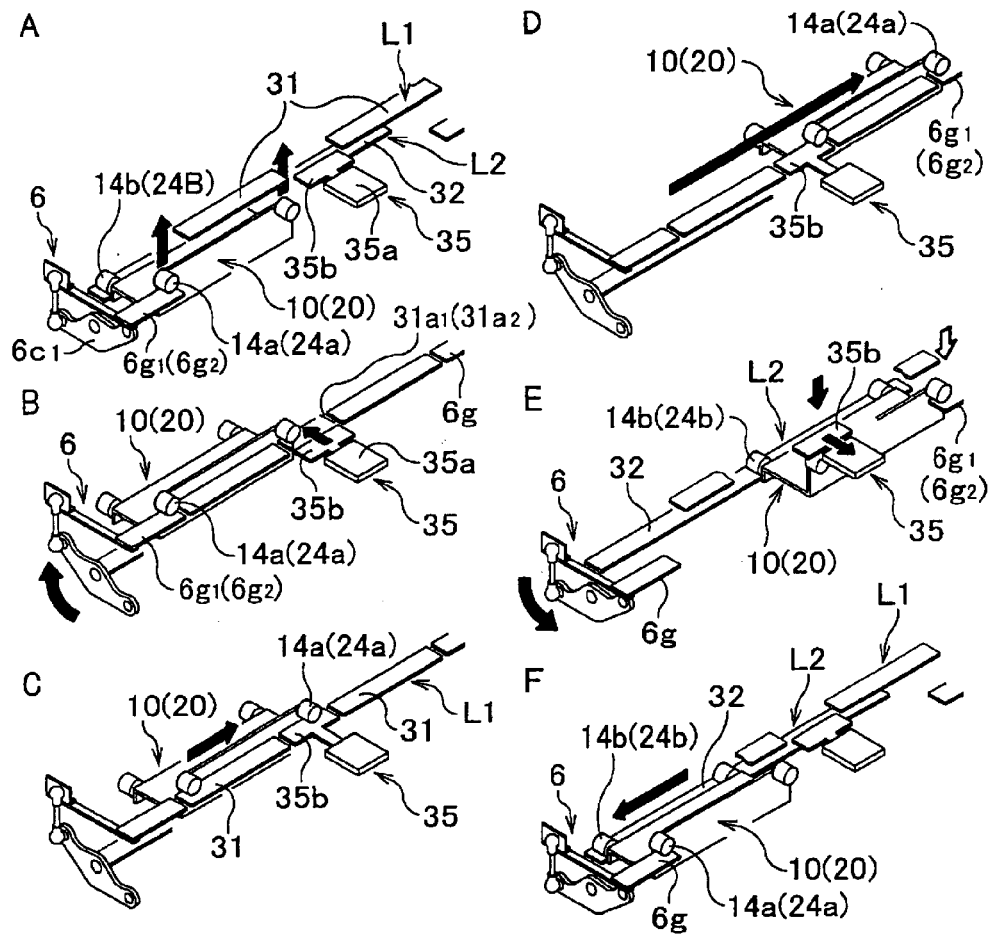
FIGS. 10A through 10F are schematic views illustrating the hoisting operation and the conveying operation of the exposure apparatus.

As shown in FIGS. 7, 10, and 11, the first transferring passage L1 extends parallel to the transferring direction of the tables 10, 20. The first transferring passage L1 is provided with right and left upper roller guide rails 31 arranged between the load/unload position P1 and the exposure position P2, cutouts 31a1 each formed in the center of the conveying direction (longitudinal direction) of the upper roller guide rails 31, assist rail mechanisms 35 for supplying cutouts 31a1 with auxiliary transferring passages, and hoist assist rails 6g1, 6g2 positioned at both ends of the respective upper roller guide rails 31 and elevated and lowered by the hoist mechanism 6.

As seen in FIGS. 7 and 10, the upper roller guide rails 31 are fixed to the housing 2. Each upper roller guide rail 31 has a length such that when both tables 10, 20 are positioned in the load/unload position P1 and the exposure position P2, one conveyor roller 14 (24) is placed on the hoist assist rail 6g1 (6g2) and the other roller 14 (24) is placed on the cutout 31a1 (31a2). Of these upper roller guide rails 31, one of the right and left upper roller guide rails 31 is for guiding the conveyor rollers 14 of the first table 10, and the other of the right and left upper roller guide rail 31 is for guiding the conveyor rolls 24 of the second table 20.

Further, each cutout 31a1, 31a2 has a length such that when both tables 10, 20 are positioned in the load/unload position P1 and the exposure position P2, the upper roller 14a of the conveyor roller 14 and the upper roller 24a of the conveyor roller 24 can be placed thereon.

Each assist rail mechanism 35 includes: an assist rail 35b positioned in the same plane with cutout 31a1, 31a2 of the upper roller guide rail 31; and an assist rail drive portion 35a for retractably driving the assist rail 35b. The assist rail mechanism 35 operates synchronously with the hoist assist rail 6g1 (6g2) of the hoist mechanism to be described later.

The second transferring passage L2 extends under the first transferring passage L1 and includes right and left lower roller guide rails 32 having a transverse setting width smaller than that of the right and left upper roller guide rails 31 of the first transferring passage L1. Of these lower roller guide rails 32, one of the right and left lower roller guide rails 32 is for guiding the lower rollers 14b of the first table 10, and the other of the right and left lower roller guide rails 32 is for guiding the lower rollers 24b of the second table 20.

Figure 9:
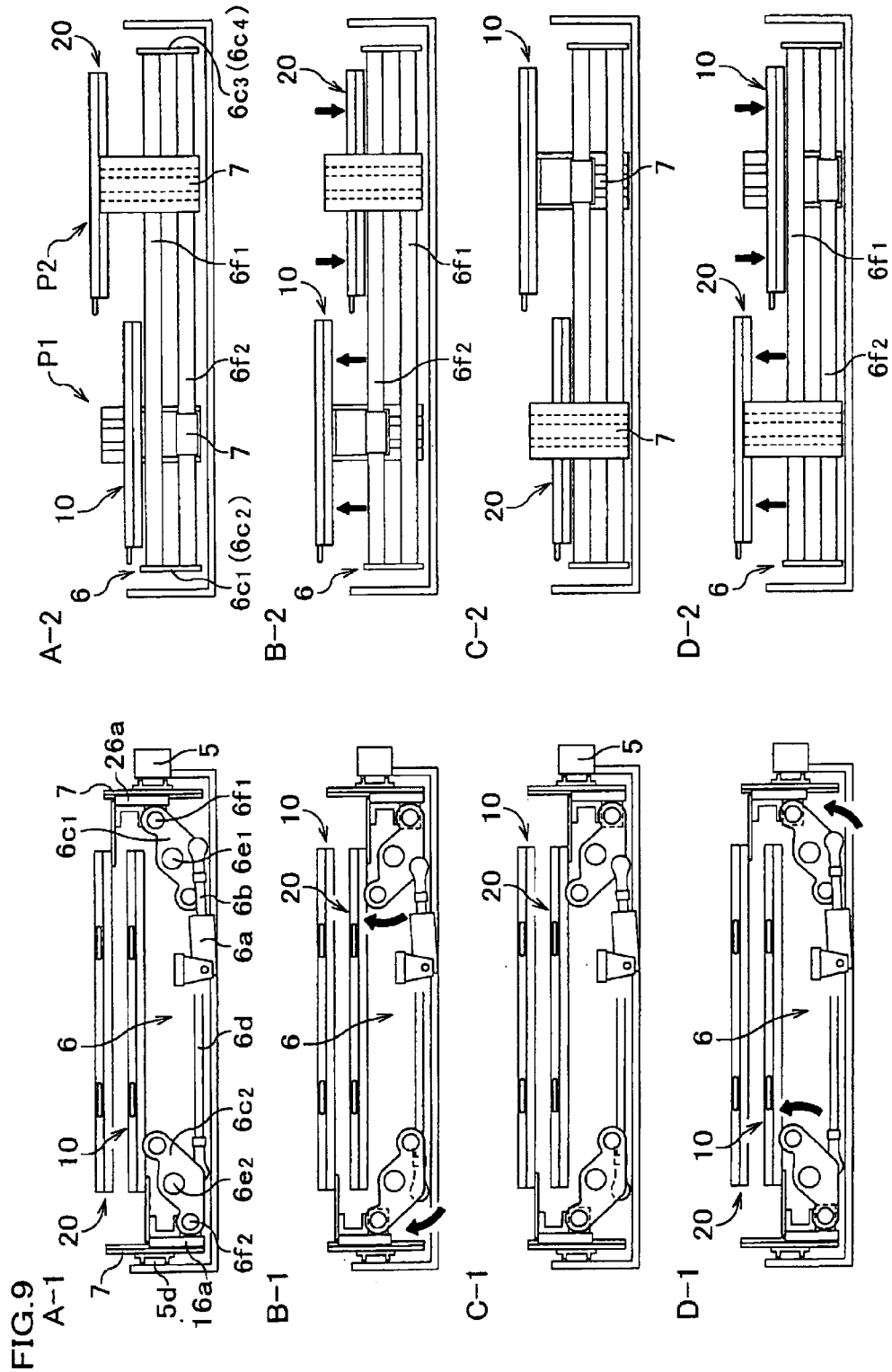

With reference to FIGS. 1 and 9, the hoist mechanism 6 will be described. The hoist mechanism 6 includes: a first rotation center rod 6e1 and a second rotation center rod 6e2 extending from the load/unload position P1 to the exposure position P2 and positioned parallel to each other below the first and second tables 10, 20 along the conveying direction of the tables 10, 20; plate-like first link member 6c1 and second link member 6c2 respectively fixed to the end of the first rotation center rod 6e1 or the second rotation center rod 6e2; a first hoist rod 6f1 and a second hoist rod 6f2 parallel to the first rotation center rod 6e1 and the second rotation center rod 6e2 and respectively engaged with the first link member 6c1 or the second link member 6c2; an engage rod 6d engaged with the first link member 6c1 and the second link member 6c2 and synchronously operating these link members 6c1, 6c2; and link drive means 6a and a push rod 6b for rotating the first link member 6c1 and the second link member 6c2 at a certain angle around the first rotation center rod 6e1 and the second rotation center rod 6e2 through the engage rod 6e. As best seen in FIG. 10, the hoist mechanism 6 also engages with the hoist assist rails 6g at the first and second link members 6c1, 6c2 and opposite to the first hoist rod 6f1 and the second hoist rod 6f2, so as to elevate and lower the hoist assist rails 6g.

The first hoist rod 6f1 and the second hoist rod 6f2 of the hoist mechanism 6 are respectively engaged with the engage portion 16a and the engage portion 26a that are provided at the center of one side along the conveying direction of the first and second tables 10, 20. Both link members 6c1, 6c2 have a length from its rotation center such that the first and second tables 10, 20 are switched from the first transferring passage L1 to the second transferring passage L2 or from the second transferring passage L2 to the first transferring passage L1. The link member 6c1 (6c2) may have any shape, size, and arrangement, as long as it can engage with the first hoist rod 6f1 (second hoist rod 6f2) and the hoist assist rail 6g with the first rotation center rod 6e1 (second rotation center rod 6e2) positioned therebetween.

With reference to FIG. 6, the light-exposure mechanism 8 will be described below. In this preferred embodiment, the light-exposure mechanism 8 is constructed to radiate parallel rays against the work W. However, other known light-exposure mechanism used for the exposure apparatus may be used, such as metal halide lamp radiating scattered light.

The light-exposure mechanism 8 includes: a discharge lamp 8a, such as a short-arc lamp, for radiating certain wave-length of ultraviolet rays; an elliptical reflection mirror 8b which covers the discharge lamp 8a from the backside; fly-eye lens 8c for adjusting and equalizing the energy of the radiated light from the discharge lamp 8a and the elliptical reflection mirror 8b against the radiating surface; a reflection mirror 8d for reflecting the radiation light from the fly-eye lens 8c; and a reflection mirror 8e for reflecting the radiation light from the reflection mirror 8d as parallel rays against the exposure position P2.

The area where the discharge lamp 8a is set and the area where the work W is set are divided by partitions, and a non-illustrated cooling mechanism such as a cooling fan is preferably provided to cool the area where the discharge lamp 8a is set.

Next, various operations of the exposure apparatus 1 will be described in relation to the load/unload operation, the alignment operation, the hoisting operation, the conveying operation, the exposure operation, the light-transmissible plate separating operation, and the light-transmissible plate sliding operation.

Firstly, with reference to FIGS. 6 and 13, the whole operations of the exposure apparatus 1 will be described.

As best seen in FIGS. 6 and 13A, a work W is loaded and aligned with the mask M on the first table 10 in the load/unload position P1, while a work W on the second table 20 is exposed to light in the exposure position P2. At the start of the exposure apparatus 1, the exposure operation is not carried out because a work W is not loaded on the second table 20. After the alignment operation and the exposure operation are completed, as shown in FIG. 13B, the first table 10 rises to the first transferring passage L1 through the hoist guide 7 and by the hoist mechanism 6, while the second table 20 lowers to the second transferring passage L2 through the hoist guide 7 and by the hoist mechanism 6.

As shown in FIG. 13C, the first table 10 is then transferred to the exposure position P2 along the first transferring passage L1 by means of the conveyor mechanism 5. Meanwhile, the second table 20 is transferred to the load/unload position P1 along the second transferring passage L2 by means of the conveyor mechanism 5. When doing so, by the light-transmissible plate slide mechanism 9 the light-transmissible plate 21 of the second table 20 slides off from the stage plate 22 in the reverse direction of the conveying direction of the second table 20, and the stage plate 22 is transferred to the load/unload position P1. Meanwhile, by the light-exposure mechanism 8 the exposure operation is applied to the first table 10 that has been transferred to the exposure position P2.

As shown in FIGS. 13D and 6, when a work W is loaded on the stage plate 22 of the second table 20 that has been transferred to the load/unload position P1, the light-transmissible plate slide mechanism 9 slides the light-transmissible plate 21 toward the stage plate 12 so that the alignment operation is performed through the alignment mechanism 3 and the alignment table 4. As shown in FIG. 13E, the second table 20 that is positioned in the load/unload position P1 and to which the alignment operation has been applied rises to the first transferring passage L1 through the hoist mechanism 6. Meanwhile, the first table 10 that is positioned in the exposure position P2 and to which the exposure operation has been applied lowers to the second transferring passage L2 through the hoist mechanism 6.

As shown in FIGS. 13F and 6, the first table 10 is then transferred to the load/unload position P1 along the second transferring passage L2 by means of the conveyor mechanism 5. Meanwhile, the second table 20 is transferred to the exposure position P2 along the first transferring passage L1 by means of the conveyor mechanism 5. When doing so, by the light-transmissible plate slide mechanism 9 the light-transmissible plate 11 of the first table 10 slides off from the stage plate 12 in the reverse direction of the conveying direction of the first table 10, and the stage plate 12 is transferred to the load/unload position P1. The worker then removes the exposed work W from the stage plate 12 and sets another work W on the stage plate 12. As shown in FIGS. 13G and 6, when the work W is set on the stage plate 12 of the first table 10, the light-transmissible plate slide mechanism 9 slides the light-transmissible plate 11 toward the stage plate 12 so that the alignment operation is performed through the alignment mechanism 3 and the alignment table 4.

The exposure apparatus 1 alternately carries out the alignment operation and the exposure operation on the work W with the aforementioned operations illustrated in FIGS. 13A through 13G being repeated. Each of the aforementioned operations will be described in detail.

Loading Operation of Work W

As shown in FIGS. 1 and 6, the first table 10 and the second table 20 are respectively positioned in the load/unload position P1 and the exposure position P2 arranged at both conveying ends of the first and second transferring passages L1, L2. In the load/unload position P1, the first table 10 is ready to place a work W on the stage plate 12 with the light-transmissible plate 11 slid off from the stage plate 22. In order to specify the alignment mark Wm of the work W, non-illustrated laser radiation means of the alignment mechanism 3 radiates an infrared laser beam. The worker places a work W on the stage plate 12 of the first table 10 in alignment with the alignment mark Wm.

When the work W is placed on the stage plate 12, the exposure apparatus 1 operates such that the work suction means 18b of the suction mechanism 18 actuates and sucks the work W on the stage plate 12. At the same time, as shown in FIGS. 12C-1 through 12D-2, the light-transmissible plate conveying/driving means 9c1 of the light-transmissible plate slide mechanism 9 operates such that the light-transmissible plate push guide means 9c2 pushes the rear plate-support member 11d of the light-transmissible plate 11 and slides the slide frame 9a3 along the slide projections 9a1 until the mask M of the light-transmissible plate 11 faces to the work W of the stage plate 12.

When the mask M faces to the work M, the exposure apparatus 1 actuates the drive portions 2a of the abutting member 2A, so that the abutment positioning portions 2c advance to abut against the positioning protrusions 11c of the first table 10, as illustrated in FIG. 3. When doing so, the light-transmissible plate push guide means 9c2 (FIG. 12D-2) continuously pushes the rear plate-support member 11d of the light-transmissible plate 11, thereby positioning the light-transmissible plate 11 in the predetermined abutting reference position.

Alignment Operation

As best seen in FIGS. 8A and 8B, when the light-transmissible plate 11 to which the mask M has been set is positioned, the sucking pads 4b of the alignment table 4 (FIG. 5) rise to suck and retain the stage plate 12. At the same time, the alignment/placement table 4a rises so that the stage plate 12 is elevated remotely from the plate support portion of the frame member 16 until the work W abuts against the mask M. When the mask M and the work W abut to each other, the main suction means 18a actuates to retain the mask M and the work W under vacuum.

The alignment mechanism 3 pictures the alignment marks Mm, Wm of the mask M and the work W (FIG. 1). If the alignment marks Mm, Wm are not within the allowable range, the exposure apparatus 1 calculates the distance required for alignment and transmits a signal to the alignment table 4. Thereafter, as seen in FIG. 8C, the exposure apparatus 1 disengages the retention of the mask M and the work W by the main suction means 18a. At the same time, the exposure apparatus 1 actuates the work suction means 18b to suck the work W against the stage plate 12. The exposure apparatus 1 lowers the alignment table 4 by the alignment/drive portion 4c and adjusts the position of the alignment table 4 in the X, Y or θ direction with the work W sucked against the stage plate 12.

As seen in FIG. 8D, the exposure apparatus 1 elevates the alignment table 4 so that the main suction means 18a sucks the mask M and the work W again. The alignment mechanism 3 pictures the alignment marks Mm, Wm (FIG. 1), and if the alignment marks Mm, Wm are within the allowable range, the alignment table 4 lowers as illustrated in FIG. 8E, so that the alignment operation is completed with the light-transmissible plate 11 and the stage plate 12 sucked under vacuum.

Hoisting operation by the hoist mechanism will be described below.

As shown in FIGS. 9A-1 through 9B-2, when the alignment operation is completed, the first table 10 positions in the load/unload position P1 at one conveying end of the second transferring passage L2 and the second table 20 positions in the exposure position P2 at the other conveying end of the first transferring passage L1. The hoist mechanism 6 then switches the transferring passages of the first and second tables 10, 20 as illustrated in FIGS. 9B-1 and 9B-2.

To be more specific, the hoist mechanism 6 actuates the link drive means 6a and elongates the push rod 6b for a certain length, so that the first link member 6c1 rotates for a certain angle around the first rotation center rod 6e1 and the second link member 6c2 is rotated by the engage rod 6d for a certain angle around the second rotation center rod 6e2. The hoist mechanism 6 elevates the first hoist rod 6f1 and lowers the second hoist rod 6f2, so that the first table 10 is elevated along the hoist guide 7 to the first transferring passage L1 and the second table 20 is lowered along the hoist guide 7 to the second transferring passage L2.

In this instance, the hoist assist rail 6g1 onto which the upper roller 14a of the first table 10 is placed rises to the same height level with the upper roller guide rails 31, and the hoist assist rail 6g2 onto which the upper roller 24a of the second table 20 is placed lowers.

During the hoisting operation, the first table 10 rises with the engage portion 16a sliding along the hoist guide 7. As shown in FIGS. 10A, 10B, and 7, when the first link member 6c1 rotates for a certain angle, the front conveyor roller 14 that is positioned at the front side relative to the conveying direction of the first table 10 (at the side facing toward the load/unload position P1) is elevated by the upward movement of the hoist assist rail 6g1, and the rear conveyor roller 14 passes through the cutout 31a1 from downward to upward. Therefore, the first table 10 rises from the second transferring passage L2 to the first transferring passage L1.

Meanwhile, the second table 20 lowers with the engage portion 16a sliding along the hoist guide 7. As shown in FIGS. 10D, 10E, and 7, when the second link member 6c2 rotates for a certain angle, the front conveyor roller 24 that is positioned at the front side relative to the conveying direction of the second table 20 (at the side facing toward the exposure position P2) is lowered by the downward movement of the hoist assist rail 6g2, and the rear conveyor roller 24 passes through the cutout 31a2 from upward to downward. Therefore, the second table 20 lowers from the first transferring passage L1 to the second transferring passage L2.

As shown in FIG. 11A, when the second table 20 positioned in the exposure position P2 lowers, the stage plate 22 is away from the light-transmissible plate 21. In other words, the stage plate 22 is supported on the frame member 26 after the sucking operation of the main suction means 18a is disengaged. Meanwhile, as shown in FIG. 11B, when the first table 10 is elevated to the first transferring passage L1, the stage plate 12 is supported on the frame member 16 in a manner sucked against the light-transmissible plate 11 through the main suction means 18a.

As seen in FIGS. 9A-1 through 9D-2, the hoist mechanism 6 alternately elevates and lowers the first and second tables 10, 20 in the load/unload position P1 and the exposure position P2, thereby switching the conveying direction of the tables 10, 20.

The conveying operation will be described below.

As seen in FIGS. 1 and 12A-1 through 12C-2, when the conveyor actuator 5a of the conveyor mechanism 5 actuates and moves the hoist guide 7 of the second table 20 toward the load/unload position P1, the drive belt 5c to which the hoist guide 7 is fixed is transferred while being guided by the belt guides 5c. Therefore, the hoist guide 7 that is engaged with the first table 10 is transferred to the exposure position P2 along the linear guide and with the conveyor rollers 14 guided along the upper roller guide rail 31.

In this instance, as shown in FIGS. 10B, 1C, and 10D, because the assist rail mechanism 35 provided at the first transferring passage L1 supplies the cutout 31a1 with the assist rail 35b to keep the transferring passage, the upper rollers 14a of the first table 10 smoothly move along the upper roller guide rail 31. The front upper roller 14a of the first table 10 that has been transferred to the exposure position P2 is placed on the hoist guide rail 6g1 as illustrated in FIG. 10D.

As shown in FIGS. 1 and 12A-1 through 12C-2, when the conveyor actuator 5a of the conveyor mechanism 5 actuates and moves the hoist guide 7 of the second table 20 toward the load/unload position P1, the lower rollers 24b of the second table 20 move along the lower roller guide rail 32 toward the load/unload position P1.

Figure 12:
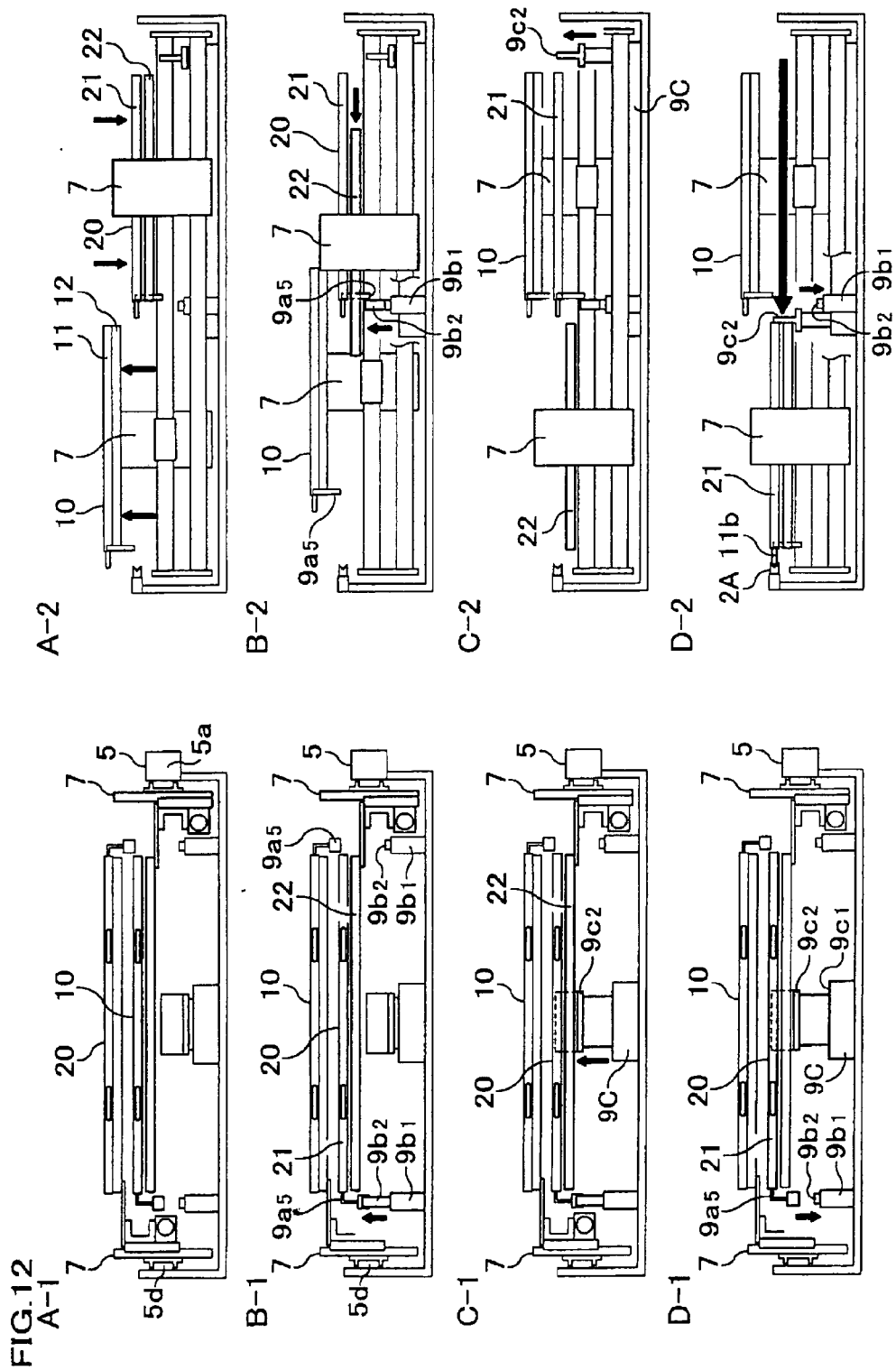

When the second table 20 is transferred to the load/unload position P1, the light-transmissible plate 21 and the stage plate 22 are transferred separately to each other. In other words, the abutment stop 9b1 of the slide actuation means 9B that is arranged in the second transferring passage L2 is elevated by the drive portion 9b2 and abuts against the stopper plate 9a5. As seen in FIGS. 2 and 12B-1 through 12B-2, when the stopper plate 9a5 abuts against the abutment stop 9b1, the slide frame 9a3 slides along the slide projections 9a1 of the frame member 26 so that the frame member 26 (stage plate 22) is transferred to the load/unload position P1 in a manner remote from the light-transmissible plate 21.

The lower rollers 24b of the second table 20 that is transferred to the load/unload position P1 move along the lower roller guide rail 32 of the second transferring passage L2, and the front upper roller 24a of the second table 20 is placed on the hoist guide rail 6g2. In a case where the stage plate 22 that has been transferred to the load/unload position P1 supports an exposed work W, the operation of the work suction means 18b is released and the exposed work W is removed. In this instance, because the light-transmissible plate 21 is slid open, the worker only removes the exposed work W.

As previously described, the worker then places a work W on the stage plate 22 of the second table 20. The abutment stop 9b1 of the slide actuation means 9B is then lowered by the drive portion 9b2. As shown in FIGS. 2 and 12C-1 through 12D-2, the light-transmissible plate push guide means 9c2 of the light-transmissible plate guiding means 9C operates the light-transmissible plate conveying/driving means 9c1 to push the rear plate-support member 21d of the light-transmissible plate 21. The slide frame 9a3 then slides along the slide projections 9a1 of the frame member 26 until the light-transmissible plate 21 faces to the stage plate 22. After the loading operation, the alignment operation is carried out as previously described.

Exposure Operation

When the first table 10 is transferred to the exposure position P2, the discharge lamp 8a of the light-exposure mechanism 8 radiates light, such as ultraviolet rays, for a predetermined length of time through the optical system (8b to 8e) to thereby carry out the exposure operation. The exposure operation is carried out in a stable and reliable manner because the first and second tables 10, 20 are transferred to the exposure position P2 in the same height level and the mask M is previously fixed to the light-transmissible plate 11, 21.

As previously described, the exposure apparatus 1 repeats the alignment operation, the exposure operation, the hoisting operation, and the conveying operation, so that the first and second tables 10, 20 are alternately transferred to the exposure position P2 and the works W set thereon are in turn exposed to the exposure process.

While the invention has been described in detail with reference to a specific embodiment thereof, it will be apparent to one skilled in the art that various changes and modifications may be made without departing from the scope of the claims.

In this preferred embodiment, the exposure position P2 is arranged at one conveying end of the first transferring passage L1 and the load/unload position P1 is arranged at the other conveying end of the second transferring passage L2. However, the load/unload position P1 may be arranged in the first transferring passage L1, while the exposure position P2 is arranged in the second transferring passage L2.

Further, in the aforementioned exposure apparatus 1, the hoist mechanism 6 has been described as a link mechanism. However, the first and second tables 10, 20 may be elevated or lowered by a lift pin hoist mechanism (not show) provided in the load/unload position P1 and the exposure position P2. In this instance, the hoist guides 7, 7 are preferably provided. In the case where the hoist guides 7, 7 are not provided, it is preferable to provide engage nails (not shown) movable along the transferring passages and retractable not to prevent the movement of the first and second tables 10, 20.

Further, in the aforementioned exposure apparatus 1, the conveyor mechanism 5 has been described such that the first and second tables 10, 20 are transferred by the drive belt 5b and the belt guides 5c. However, right and left conveyor actuators 5a may be provided in a synchronous manner.

The aforementioned exposure apparatus 1 has the following advantages.

(1) The exposure operation is carried out with the first and second tables 10, 20 being transferred to the exposure position in the same height level because the first and second tables 10, 20 are alternately transferred to the load/unload position P1 and the exposure position P2 by the conveyor mechanism 5 and the hoist mechanism 6. Further, the alignment operation and the exposure operation can be performed accurately by reducing the number of processes operated by the worker.

In the exposure apparatus 1, structure of the light-transmissible plate 11 and the stage plate 12 can be simplified, and when the stage plate 12 is displaced from the frame member 16, 26, unlike the prior art exposure apparatus wherein the whole table is separately elevated and lowered from the conveyor mechanism, the minimum driving force is required to elevate and lower the stage plate 12.

(2) The first and second tables 10, 20 are transferred to the exposure position P2 in the same height level to carry out the exposure operation because the first and second tables 10, 20 are alternately transferred to the load/unload position P1 and the exposure position P2 with the hoist mechanism 6 elevating or lowering the tables 10, 20 to the first or second transferring passage L1, L2 through the hoist guides 7, 7. Further, in the exposure apparatus 1, the alignment operation is carried out in the load/unload position P1 with the mask M and the work W being faced to each other. This can achieve the exposure operation with improved alignment accuracy.

(3) The light-transmissible plate 11 can be readily and smoothly disengaged and separated from the tables 10, 20 because the worker grips the positioning protrusions 11c of the front plate-support member 11b provided at the plate member 11a and removes the light-transmissible plate 11 from the tables 10, 20. The light-transmissible plate 11 is simplified in structure.

(4) The light-transmissible plate guiding means 9C pushes the rear plate-support member 11d of the light-transmissible plate 11 against the abutting member 2A arranged in the load/unload position P1, which leads to improved accuracy of the alignment operation.

(5) Each frame member 16, 26 of the first and second tables 10, 20 remotely and oppositely supports the stage plate 12 with respect to the light-transmissible plate 11. The alignment mechanism 3 makes the work W abut against the mask M in the load/unload position P1, and the hoist mechanism 6 elevates them with the work W and the mask M being sucked by the suction mechanism 18, 28, and thereafter the conveyor mechanism 5 conveys the work W and the mask M to the exposure position P2. In the exposure position P2, the light-transmissible plate 11 and the stage plate 12 onto which the exposed work W is placed are remotely supported by the frame member 16, 26 after the suction mechanism 18, 28 is disengaged. The hoist mechanism 6 lowers the work W and the mask M, and thereafter the conveyor mechanism 5 conveys them to the load/unload position P1. Therefore, the alignment operation is carried out by actually picturing the alignment marks of the mask M and the work W. The stage plate 12 is always guided to the reference position because the frame member 16, 26 supports the stage plate 12 in a separate manner.

(6) When the operation of the suction mechanism 18, 28 is disengaged in the exposure position P2, the stage plate 12 for placing the exposed work W is separated from the light-transmissible plate 11 and guided to the predetermined position by means of the guide means 13, 23 projecting from the plate support portion of the frame member 16, 26. Therefore, the alignment operation can be always started from the same support reference position even if the stage plate 12 moves during the alignment operation.

(7) The conveyor mechanism 5 transfers the second table 20 (the first table 10) to the load/unload position P1. When the stopper plate 9a5 abuts against the abutment stop 9b1, the light-transmissible plate 11 slides away from the frame member 26 (16) along the slide projections 9a1, so that the stage plate 12 is positioned in the load/unload position P1 ready for removing the exposed work W. Therefore, the exposed work W is readily replaced with another work W in the load/unload position. Further, the light-transmissible plate guiding means 9C pushes the light-transmissible plate 11 until the light-transmissible plate 11 slides along the slide projections 9a1 and faces to the stage plate 12, so as to function as push guide means for continuously pushing the light-transmissible plate 11 along the conveying direction of the table. This simplifies the structure of the light-transmissible plate 11.

(8) The first and second tables 10, 20 are transferred along the first and second transferring passages L1, L2 by the conveyor mechanism 5. The first and second tables 10, 20 are stably and reliably transferred because of the conveyor rollers 14, 24 movable along the guide rails 31, 32 and the engage portions 16a, 26a engageable with the hoist guides 7. Further, the exposure apparatus 1 becomes smaller in size because each engage portion 16a, 26a is elevated or lowered along the hoist guide 7 and the conveyor rollers 14, 24 are elevated or lowered through the cutout 31a1, 31a2 of the guide rail 31, 32, so that the table 10, 20 is switched from one transferring passage L1, L2 to the other transferring passage L2, L1.

(9) Because the drive belt 5b and the belt guides 5c are provided as drive means for the conveyor mechanism 5, the structure of the conveyor mechanism can be simplified and the first and second tables 10, 20 are accurately and synchronously transferred.

(10) The link drive means 6a of the hoist mechanism 6 rotate the first and second link members 6c1, 6c2 for a certain angle around the first and second rotation center rods 6e1, 6e2. Therefore, the first and second hoist rods 6f1, 6f2 are elevated or lowered to guide the first and second tables 10, 20. This leads to less install space requirement and a reliable switching operation of the first and second tables 10, 20 between the first and second transferring passages L1, L2.

(11) In the load/unload position P1, the worker can remove the exposed work W from the stage plate 12 and place another work W without operating the light-transmissible plate 11. Further, because the alignment operation and the exposure operation are carried out in the same height levels, it is possible to improve the accuracy of the respective operations as well as to reduce the work load of the worker.

(12) According to the method of conveying a mask M and a work W, the mask M and the work W are transferred along the loop. This makes it possible to effectively utilize the limited inner space of the exposure apparatus 1 and to reduce the size of the exposure apparatus 1.

What is claimed is:

1. An exposure apparatus comprising:
   a first table and a second table each including a stage plate on which a work is placed, and a light-transmissible plate to which a mask is previously mounted, the first and second tables being transferred alternately between a load/unload position where the work is loaded/unloaded and aligned with the mask and an exposure position where the aligned set of work and mask is exposed to light;
   a first transferring passage and a second transferring passage arranged at two different levels between the load/unload position and the exposure position, wherein the first transferring passage transfers the first table and the second table alternately, while the second transferring passage transfers the second table and the first table alternately;
   a hoist mechanism which elevates one of the first and second tables to the first transferring passages, and lowers the other of the second and first tables to the second transferring passage;

a conveyor mechanism which conveys the first and second tables elevated or lowered by the hoist mechanism along the first and second transferring passages, one from the load/unload position to the exposure position, and the other from the exposure position to the load/unload position;

an alignment mechanism which aligns the work that is placed on one of the tables conveyed to the load/unload position with the mask; and a light-exposure mechanism which radiates light to the work placed on the other of the tables conveyed to the exposure position.

2. An exposure apparatus according to claim 1, wherein said hoist mechanism engages with the first and second tables, respectively, through hoist guide means, and wherein said conveyor mechanism conveys the first and second tables by drive means engageable with the hoist guide means.

3. An exposure apparatus according to claim 2, wherein said light-transmissible plate includes a plate member which allows transmission of light and to which the mask is set, a front plate-support member provided at a front side of the plate member in relation to a conveying direction of the table from the exposure position to the load/unload position, a positioning protrusion extending from the front plate-support member, and a rear plate-support member opposite to the front plate-support member and fixed to the table so as to be engageable with a rear side of the plate member.

4. An exposure apparatus according to claim 3, wherein an abutting member is provided in the load/unload position to move toward and away from the positioning protrusion of the light-transmissible plate, and wherein light-transmissible plate guiding means is provided to push the rear plate-support member of the light-transmissible plate so that the positioning protrusion abuts against the abutting member.

5. An exposure apparatus according to claim 4, wherein each of said first and second tables includes a frame member for remotely and oppositely supporting the stage plate with respect to the light-transmissible plate, and a suction mechanism for sucking a work against the mask.

6. An exposure apparatus according to claim 5, wherein said frame member has guide means for retaining the stage plate at a predetermined position.

7. An exposure apparatus according to claim 5, wherein each of said first and second tables includes a light-transmissible plate slide mechanism which slidably engages with slide means provided on the frame member, so that the stage plate is slidable against the light-transmissible plate.

8. An exposure apparatus according to claim 7, wherein each of said first and second tables includes a stopper plate laterally extending with respect to the second transfering passage extending from the exposure position to the load/unload position, and wherein an abutment stop is provided to move toward and away from a sliding locus of the stopper plate.

9. An exposure apparatus according to claim 2, wherein each of said first and second tables is provided with conveyor rollers at one of sides extending along the first and second transferring passages, and an engage portion engageable with the hoist guide means at the other side, wherein a guide rail is arranged at both sides of the first and second transferring passages so that the conveyor rollers move along the guide rail, and wherein each guide rail of the first transferring passage includes a cutout through which the conveyor rollers are elevated and lowered, and an assist rail movable toward and away from the cutout.

10. An exposure apparatus according to claim 9, wherein said drive means is arranged surrounding the load/unload position and the exposure position and includes a drive belt engageable with the hoist guide means of the first and second tables and conveying the first and second tables along the first and second transferring passages, and belt guides for guiding the drive belt.

11. An exposure apparatus according to claim 9, further comprising a first hoist rod engageable with the first table through the hoist guide means at the load/unload position and the exposure position, a second hoist rod engageable with the second table through the hoist guide means at the load/unload position and the exposure position, a first rotation center rod connected to the first hoist rod through a first link member and being a rotation fulcrum at the time of elevating or lowering the first hoist rod through the first link member, a second rotation center rod connected to the second hoist rod through a second link member and being a rotation fulcrum at the time of lowering or elevating the second hoist rod through the second link member, and link drive means for rotatably and synchronously moving the first and second link members.

12. A method of conveying a mask and a work, in which a first table to which a mask and a work are set is conveyed from a fist position to a second position via a fist transferring passage, while a second table to which a mask and a work are set is conveyed from the second position to the first position via a second transferring passage, the method comprising the steps of:

aligning the mask and the work on the first table at the first position, while exposing the work on the second table to light through the mask at the second position; and conveying the first table and the second table in an endless manner along a loop, which extends across the first and second positions and includes the first and second transferring passages.

13. A method of conveying a mask and a work according to claim 12, wherein the first position and the second position are parallel.

14. A method of conveying a mask and a work according to claim 12, wherein the first transferring passage and the second transferring passage are positioned vertically to each other.

15. A method of conveying a mask and a work according to claim 14, wherein the first transferring passage is arranged on top of the second transferring passage.

16. A method of conveying a mask and a work according to claim 12, wherein the loop is rectangular.

17. A method of conveying a mask and a work according to claim 12, wherein the first and second tables each includes a stage plate on which the work is placed and a light-transmissible plate to which the mask is previously mounted, and wherein the method further comprises the steps of placing the work on the stage plate and mounting the mask to the light-transmissible plate prior to the step of aligning the mask and the work on the first table at the first position.

18. An exposure apparatus according to claim 1, wherein the hoist mechanism elevates one of the first and second tables from the second transferring passage to the first transferring passage, and lowers the other one of the first and second tables from the first transferring passage to the second transferring passage.

19. An exposure apparatus according to claim 18, wherein the first table and the second table are transferred in an endless manner along a loop.

20. An exposure apparatus according to claim 18, wherein the first table and the second table are transferred in a first direction along the first transferring passage and in a second direction along the second transferring passage, and wherein the first direction is opposite to the second direction.

* * * * *